United States Patent
Sugiarto et al.

[19]

[11] Patent Number: 6,077,764
[45] Date of Patent: Jun. 20, 2000

[54] PROCESS FOR DEPOSITING HIGH DEPOSITION RATE HALOGEN-DOPED SILICON OXIDE LAYER

[75] Inventors: Dian Sugiarto, Union City; Judy Huang, Los Gatos; David Cheung, Foster City, all of Calif.

[73] Assignee: Applied Materials, Inc., Santa Clara, Calif.

[21] Appl. No.: 08/837,641

[22] Filed: Apr. 21, 1997

[51] Int. Cl.$^7$ .......................... H01L 21/44; H01L 21/4763
[52] U.S. Cl. .......................... 438/597; 438/618; 438/623; 438/627; 438/784; 438/788
[58] Field of Search ..................... 438/789, 579, 438/623, 624, 627, 788, 597, 618, 622

[56] References Cited

U.S. PATENT DOCUMENTS

| | | | |
|---|---|---|---|
| 5,261,961 | 11/1993 | Takasu et al. | 118/722 |
| 5,429,995 | 7/1995 | Nishiyama et al. | 437/238 |
| 5,661,093 | 8/1997 | Ravi et al. | 438/763 |
| 5,750,211 | 5/1998 | Weise et al. | 472/579 |
| 5,759,906 | 6/1998 | Lou | 438/623 |
| 5,763,010 | 6/1998 | Gou et al. | 427/376.2 |
| 5,807,785 | 9/1998 | Ravi | 438/624 |
| 5,827,785 | 10/1998 | Bhan et al. | 438/784 |
| 5,858,869 | 1/1999 | Chen et al. | 438/597 |
| 5,876,798 | 3/1999 | Vassilev | 427/255.3 |
| 5,908,672 | 6/1999 | Ryu et al. | 427/574 |

FOREIGN PATENT DOCUMENTS

| | | | |
|---|---|---|---|
| 07169833 | 7/1995 | Japan | H01L 21/768 |
| 08335579 | 12/1996 | Japan | H01L 21/316 |

OTHER PUBLICATIONS

T. Fukada et al., "Preparation of SiOF Films With Low Dielectric Constant By ECR Plasma CVD," *DUMIC Conference, Feb. 21–22, 1995*, pp. 43–49, Feb. 1995.

L.Q. Qian et al., "High Density Plasma Deposition and Deep Submicron Gap Fill With Low Dielectric Constant SiOF Films," *DUMIC Conference, Feb. 21–22, 1995*, pp. 50–56, Feb. 1995.

N. Hayasaka et al., High–Quality and Low Dielectric Constant $SiO_2$ CVD Using High Density Plasma, *1993 Dry Process Symposium*, pp. 163–168, Nov. 1993.

R. Laxman. "Low $\in$ Dielectrics: CVD Fluorinated Silicon Dioxides," *Semiconductor International*, pp. 71–74, May 1995.

C. Falcony et al., "High Ouality, High Deposition Rate $SiO_2$ Films At Low Temperatures Using Silicon Fluorides and Plasma Assisted Deposition Techniques," *J. Vac. Sci. Technol.*, pp. 2945–2949, Nov./Dec. 1993.

G. Passemard et al., "Fluorine Stability in Fluorosilicate Glass and Effect on Dielectric Properties," *DUMIC Conference, Feb. 20–21, 1996*, pp. 145–152, Feb. 1996.

T. Tamura et al., "Preparation of Stable Fluorine–Doped Silicon Oxide Film By Biased Helicon Plasma CVD," *DUMIC Conference, Feb. 20–21, 1996*, pp. 231–238, Feb. 1996.

A. Saproo et al., "Characterization of a Process for Deposition of Fluorine Doped $SiO_2$ From a High Density Plasma Source," *DUMIC Conference, Feb. 20–21, 1996*, pp. 239–246, Feb. 1996.

(List continued on next page.)

*Primary Examiner*—Richard T. Elms
*Assistant Examiner*—Michael S. Lebentritt
*Attorney, Agent, or Firm*—Townsend & Townsend & Crew

[57] ABSTRACT

A silicon oxide film is deposited on a substrate by first introducing a process gas into a chamber. The process gas includes a gaseous source of silicon (such as silane), a gaseous source of fluorine (such as $SiF_4$), a gaseous source of oxygen (such as nitrous oxide), and a gaseous source of nitrogen (such as $N_2$). A plasma is formed from the process gas by applying a RF power component. Deposition is carried out at a rate of at least about 1.5 $\mu$m/min. The resulting FSG film is stable and has a low dielectric constant.

33 Claims, 23 Drawing Sheets

OTHER PUBLICATIONS

J. Hsieh et al., "Deposition of Highly–Doped F–TEOS in Nitrouse Oxide–Based PECVD Process for IMD and Passivation Applications," *DUMIC Conference, Feb. 20–21, 1996*, pp. 265–268, Feb. 1996.

R. Swope et al., "Nitrous Oxide Plasma Surface Treatment of PECVD FSG Films," *DUMIC Conference, Feb. 20–21, 1996*, pp. 295–301, Feb. 1996.

H. Miyajima et al., "Water–Absorption Mechanisms of F–Doped PECVD $SiO_2$ With Low–Dielectric Constant," *VMIC Conference, Jun. 27–29, 1995*, pp. 391–393, Jun. 1995.

M. Bhan et al., "Deposition of Stable, Low K Deposition Rate $SiF_4$–doped TEOS Fluorinated Silicon Dioxide (SiOF) Films," *Thin Solid Films*, pp. 507–511 (1997).

| PARAMETER | DOPING EFFICIENCY | DEPO-RATE | QUALITY |
|---|---|---|---|
| PRESSURE (2.0 TO 5.0 TORR) | ↑ | ↓ | ↑ |
| SPACING (300 TO 500 MILL) | ↑ | ↓ | ↑ |
| HF POWER (RF1) (400 TO 17,000 WATT) | ↓ | ↓ | ↑ |
| LF POWER (RF2) (0 TO 400 WATT) | → | → | → |
| TEMPERATURE (350 TO 440 C) | ↓ | ↑ | ↑ |
| SF4 (1 TO 400 SCCM) | ↑ | → | ↓ |
| SIH4 (150 TO 300 SCCM) | ↓ | ↑ | ↓ |
| N2O (1000 TO 3000 SCCM) | ↓ | ↑ | ↓ |
| N2 (100 TO 3000 SCCM) | ↓ | → | ↑ |

FIG. 2C.

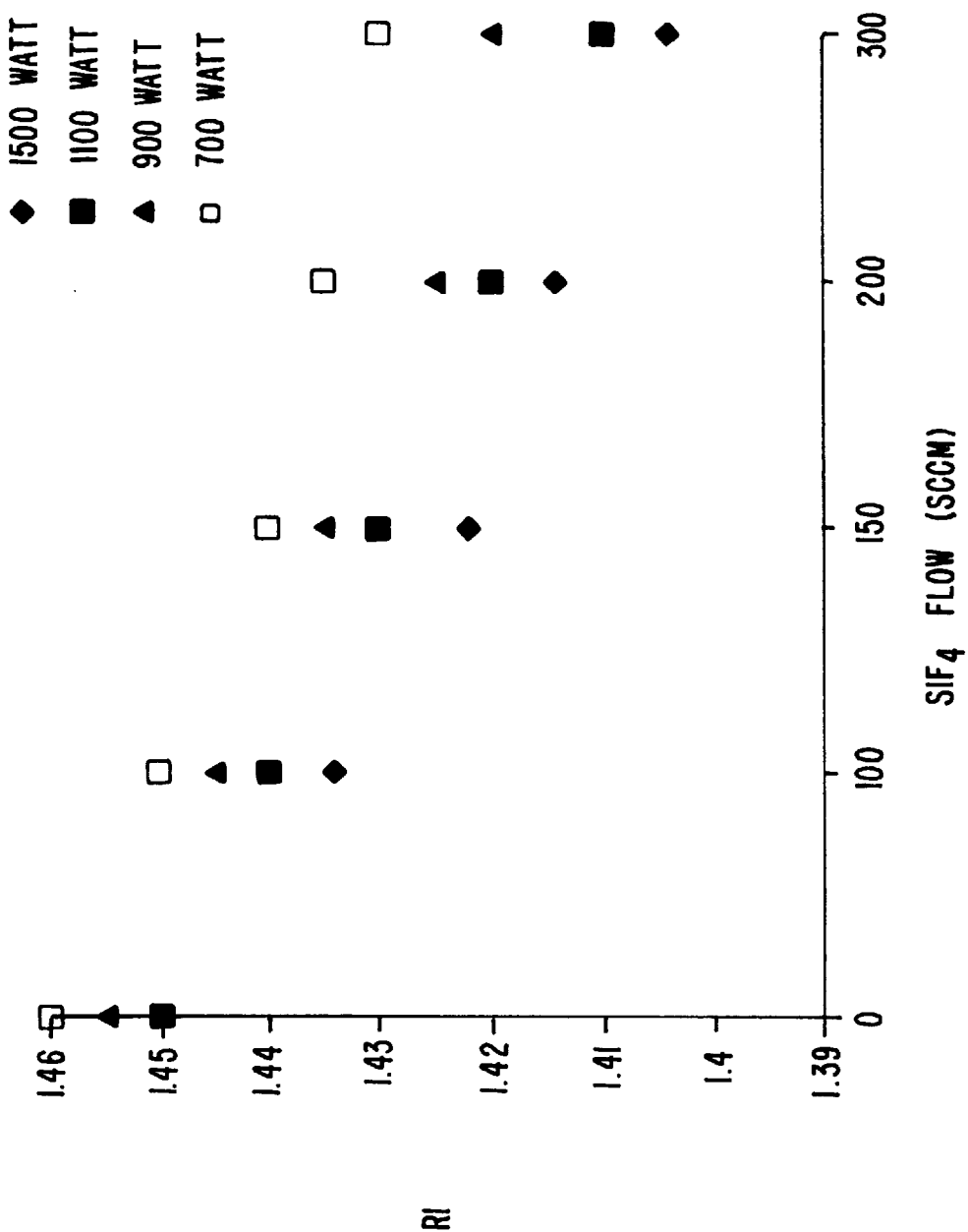

- FLOURINE OUT GAS > 475°C
- HF OUT GAS > 500°C 6,077,764

PROCESS FOR DEPOSITING HIGH DEPOSITION RATE HALOGEN-DOPED SILICON OXIDE LAYER

BACKGROUND OF THE INVENTION

The present invention relates to the deposition of halogen-doped dielectric layers during wafer processing, and more specifically to a method and apparatus for forming a high deposition rate halogen-doped silicon oxide layer having a low dielectric constant and high film stability.

One of the primary steps in the fabrication of modern semiconductor devices is the formation of a thin film on a semiconductor substrate by chemical reaction of gases. Such a deposition process is referred to as chemical vapor deposition or "CVD." Conventional thermal CVD processes supply reactive gases to the substrate surface where heat-induced chemical reactions produce a desired film. The high temperatures at which some thermal CVD processes operate can damage device structures having metal layers.

Another CVD method of depositing layers over metal layers at relatively low temperatures includes plasma enhanced CVD (PECVD) techniques. Plasma CVD techniques promote excitation and/or dissociation of the reactant gases by the application of radio frequency (RF) energy to a reaction zone near the substrate surface, thereby creating a plasma. The high reactivity of the species in the plasma reduces the energy required for a chemical reaction to take place, and thus lowers the required temperature for such CVD processes. The relatively low temperature of a PECVD process makes such processes ideal for the formation of insulating layers over deposited metal layers and for the formation of other insulating layers.

Semiconductor device geometries have dramatically decreased in size since such devices were first introduced several decades ago. Since then, integrated circuits have generally followed the two year/half-size rule (often called "Moore's Law"), which means that the number of devices that will fit on a chip doubles every two years. Today's wafer fabrication plants are routinely producing integrated circuits having 0.5-$\mu$m and even 0.35-$\mu$m features, and tomorrow's plants soon will be producing devices having even smaller geometries.

As devices become smaller and integration density increases, issues that were not previously considered important by the industry are becoming of concern. With the advent of multilevel metal technology in which three, four, or more layers of metal are formed on the semiconductors, one goal of semiconductor manufacturers is lowering the dielectric constant of insulating layers deposited between the metal layers. Such layers are often referred to as intermetal dielectric (IMD) layers. Low dielectric constant films are particularly desirable for IMD layers to reduce the RC time delay of the interconnect metallization, to prevent cross-talk between the different levels of metallization, and to reduce device power consumption.

Many approaches to obtain lower dielectric constants have been proposed. One of the more promising solutions is the incorporation of fluorine or other halogen elements, such as chlorine or bromine, into a silicon oxide layer. It is believed that fluorine, the preferred halogen dopant for silicon oxide films, lowers the dielectric constant of the silicon oxide film because fluorine is an electronegative atom that decreases the polarizability of the overall SiOF network. Fluorine-doped silicon oxide films are also referred to as fluorinated silicon glass (FSG) films.

FSG films may be deposited using fluorine sources such as $CF_4$, $C_2F_6$, and $NF_3$. One particular method of depositing an FSG film forms a plasma from a process gas that includes silicon tetrafluoride ($SiF_4$) as the fluorine source, silane ($SiH_4$) and $O_2$ precursors. It is believed that $SiF_4$ is a particularly effective fluorine source for FSG films because the four fluorine atoms bonded to a silicon atom in a molecule of the gas supply a higher percentage of fluorine into the deposition chamber for a given flow rate as compared with other fluorine sources. Additionally, $SiF_4$ has more fluorine bonded to silicon available for the plasma reaction than other fluorine sources. The use of $SiF_4$ as a source of fluorine for FSG films is discussed in more detail in U.S. Ser. No. 08/538,696, filed Oct. 2, 1995, entitled "USE OF $SIF_4$ TO DEPOSIT F-DOPED FILMS OF GREATER STABILITY"; and to U.S. Ser. No. 08/616,707, filed Mar. 15, 1996, entitled "METHOD AND APPARATUS FOR IMPROVING FILM STABILITY OF HALOGEN-DOPED SILICON OXIDE FILMS". The Ser. Nos. 08/538,696 and 08/616,707 applications are assigned to Applied Materials Inc, the assignee of the present invention.

Thus, manufacturers desire to include fluorine in various dielectric layers and particularly in intermetal dielectric layers. One problem encountered in the deposition of FSG layers is film stability. Loosely bound fluorine atoms in the lattice structure of some FSG films result in the films having a tendency to absorb moisture. The absorbed moisture increases the film's dielectric constant and can cause further problems when the film is exposed to a thermal process such as an anneal process.

The high temperature of the thermal processes can move the absorbed water molecules and loosely bound fluorine atoms out of the oxide layer through metal or other subsequently deposited layers. The excursion of molecules and atoms in this manner is referred to as outgassing. Such outgassing can be determined by detecting fluorine, hydrofluoric acid (HF) or $H_2O$ leaving the film as the film is heated to a specified temperature. It is desirable to have little or no outgassing at temperatures up to at least the maximum temperature used during substrate processing after the FSG film has been deposited (e.g., up to 450° C. in some instances).

Generally, the dielectric constant of an FSG film is related to the amount of fluorine incorporated into the film. An increase in the fluorine content of the film generally decreases the dielectric constant of the films. FSG films having a high fluorine content (e.g., above 7 or 8 atomic percent [at. %] fluorine), however, are more likely to have moisture absorption and outgassing problems than films of a lower fluorine content (e.g., lower than 7 or 8 at. % fluorine). Therefore, the development of oxide films having low dielectric constants are necessary to keep pace with some emerging technologies.

In addition, a method of increasing the stability of halogen-doped oxide films, and in particular, high fluorine content FSG films, thereby reducing moisture absorption and outgassing in the films, is also desirable.

Another concern of manufacturers is the throughput of the process. In order to have a high throughput, the deposition rate of the process has to be high. Hence, in addition to being stable, the film should have a high deposition rate to enhance deposition efficiency.

SUMMARY OF THE INVENTION

The present invention provides a halogen-doped layer having a low dielectric constant and improved stability even at high halogen-doped levels. The invention also provides a method and apparatus for forming such a layer at a high deposition rate. Film stability is improved by introducing a nitrogen source gas and a halogen source gas into a deposition chamber along with silicon and oxygen sources. A plasma is then formed from the gases to deposit a halogen-doped layer over a substrate disposed in the chamber. It is believed that the introduction of the nitrogen source reduces the amount of free or loosely bonded fluorine in the layer, thereby enhancing the stability of the layer.

An FSG film is deposited according to a preferred embodiment of the method of the present invention. In this embodiment, the nitrogen source gas is $N_2$, and the halogen source gas is $SiF_4$. The oxygen source may be from $N_2O$, and the silicon source is $SiH_4$. The ratio of $N_2$ to $SiF_4$ is between about 3 to 20, and the ratio of $N_2$ to $SiH_4$ is between about 3 to 10. In addition, the ratio of $N_2$ to $N_2O$ is between about 0.5 to 4. An FSG film deposited according to this embodiment can incorporate up to at least 16 at. % fluorine as measured using Secondary Mass Ion Spectroscopy (SIMS). In addition, the film shows substantially no fluorine or HF outgassing from the layer when heated to a temperature up to at least 475° C. and 500° C., respectively. In a more preferred embodiment of the method of the present invention, near the completion of the deposition step, the flow of $SiF_4$ is stopped several seconds before the flows of the other process gases are stopped. Employing this sequence helps further reduce loosely bonded fluorine in the film and allows for the deposition of an FSG film that has up to at least 16 at. % fluorine and shows substantially no fluorine, HF, or $H_2O$ outgassing from the layer when heated to a temperature up to at least 700° C.

These and other embodiments of the present invention, along with many of its advantages and features, are described in more detail in the text below and the attached figures.

BRIEF DESCRIPTION OF THE DRAWINGS

FIG. 2C is a chart illustrating the effect of the various parameters of the process on the doping efficiency, the deposition rate, and the quality of the film;

FIGS. 4A–4L are different test results showing the effect of increasing fluorine concentration on the stability of the insulating film of the present invention.

DETAILED DESCRIPTION OF THE PREFERRED EMBODIMENTS

I. Introduction

Figure 1A:
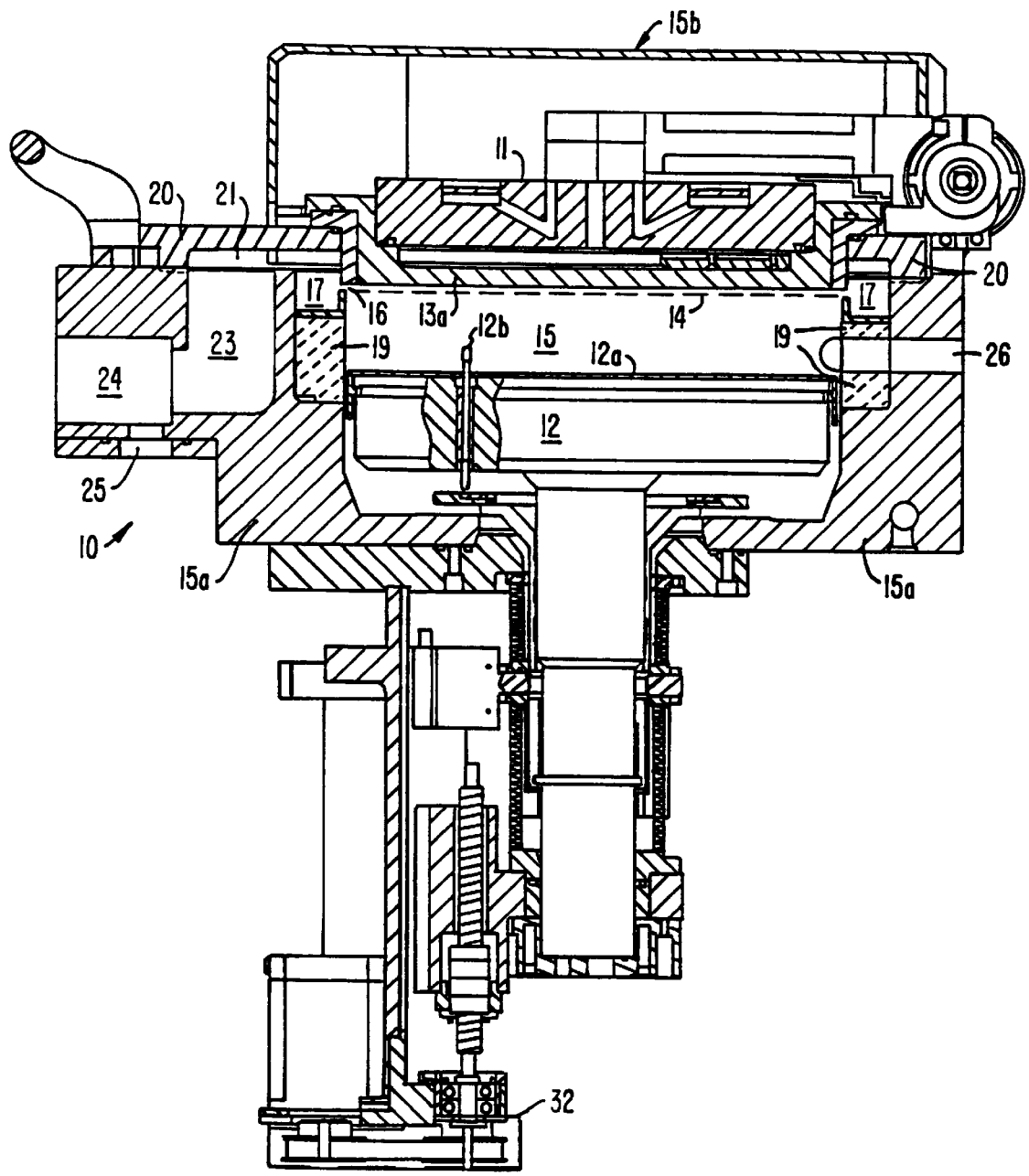
FIGS. 1A and 1B are vertical, cross-sectional views of one embodiment of a chemical vapor deposition apparatus according to the present invention.

The present invention provides a high deposition rate insulating layer having a low dielectric constant and increased film stability. The invention also provides a method and apparatus for forming such an insulating layer. The improved stability and low dielectric constant characteristics are obtained by the introduction of a nitrogen source, for example, $N_2$, into the process gas.

As previously discussed, an FSG film with a higher fluorine content generally has a lower dielectric constant as compared to a similar film with a lower fluorine content. $SiF_4$ is a particularly effective fluorine source as it has four fluorine atoms bonded to a silicon atom thereby supplying a higher percentage of fluorine into the deposition chamber for a given flow rate as compared with other fluorine sources. However, an excess of free fluorine in the plasma can adversely affect the stability of the film. This is because the excessive free fluorine typically reacts to form $SiF_2$ bonds in the film, and $SiF_2$ bonds tend to absorb water and form HF and silanol (SiOH). This is undesirable as HF may outgas from the film, thereby causing the film to subsequently flake or crack. In addition, SiOH, which remains in the film, degrades the dielectric constant of the film over a period of time when the film is exposed to humidity and temperature stresses.

Hence, a method for removal of free fluorine from the plasma to prevent formation of $SiF_2$ in the film is important to ensure film stability. It is believed that the nitrogen gas reacts with free or loosely bonded fluorine atoms during deposition to form $NF_2$ or $NF_3$, which are volatile gases that may be easily removed from the chamber during and after deposition. Hence, such free or loosely bonded fluorine atoms are prevented from being part of the various reactions that form the growing film. This in turn results in fewer loosely bonded fluorine atoms being incorporated into the FSG layer. Because fewer loosely bonded fluorine atoms are in the FSG layer, outgassing in subsequent processing stages is also reduced, thereby ensuring film stability.

In addition, $SiF_4$ is also a particularly suitable fluorine source for high deposition rate processes. Generally, an increase in the fluorine content of $CF_4$, $C_2F_6$, and $NF_3$ FSG films correlates to more etching of the film while it is deposited. In contrast, while an increase in the fluorine content of an $SiF_4$ FSG film improves the dielectric constant of the film, minimal additional etch of the film is effected by the increased fluorine content. Hence, the use of $SiF_4$ as the fluorine source further enhances the deposition efficiency.

In a preferred embodiment, the process gas includes fluorine provided by $SiF_4$, silicon provided by $SiH_4$, oxygen provided by $N_2O$, and nitrogen provided by $N_2$. The film is deposited at a rate of about 1.5–1.8 μm/min. The dielectric constant of the film is about 3.3–3.5 as measure by the C-V curve at 1 MHz in the metal insulator semiconductor (MIS) structure. The film contains about 7 percent SiF (as measured by Fourier transform infrared (FTIR) spectroscopy of the peak height ratio of SiF bonds to SiF+SiO bonds), and can incorporate up to at least 16 at. % fluorine as measured using SIMS. Finally, when deposited according to a preferred embodiment of the method of the present invention, the film shows substantially no fluorine, HF, or $H_2O$ outgassing from the layer when heated to a temperature up to at least 700° C.

II. An Exemplary CVD System

Figure 1B:
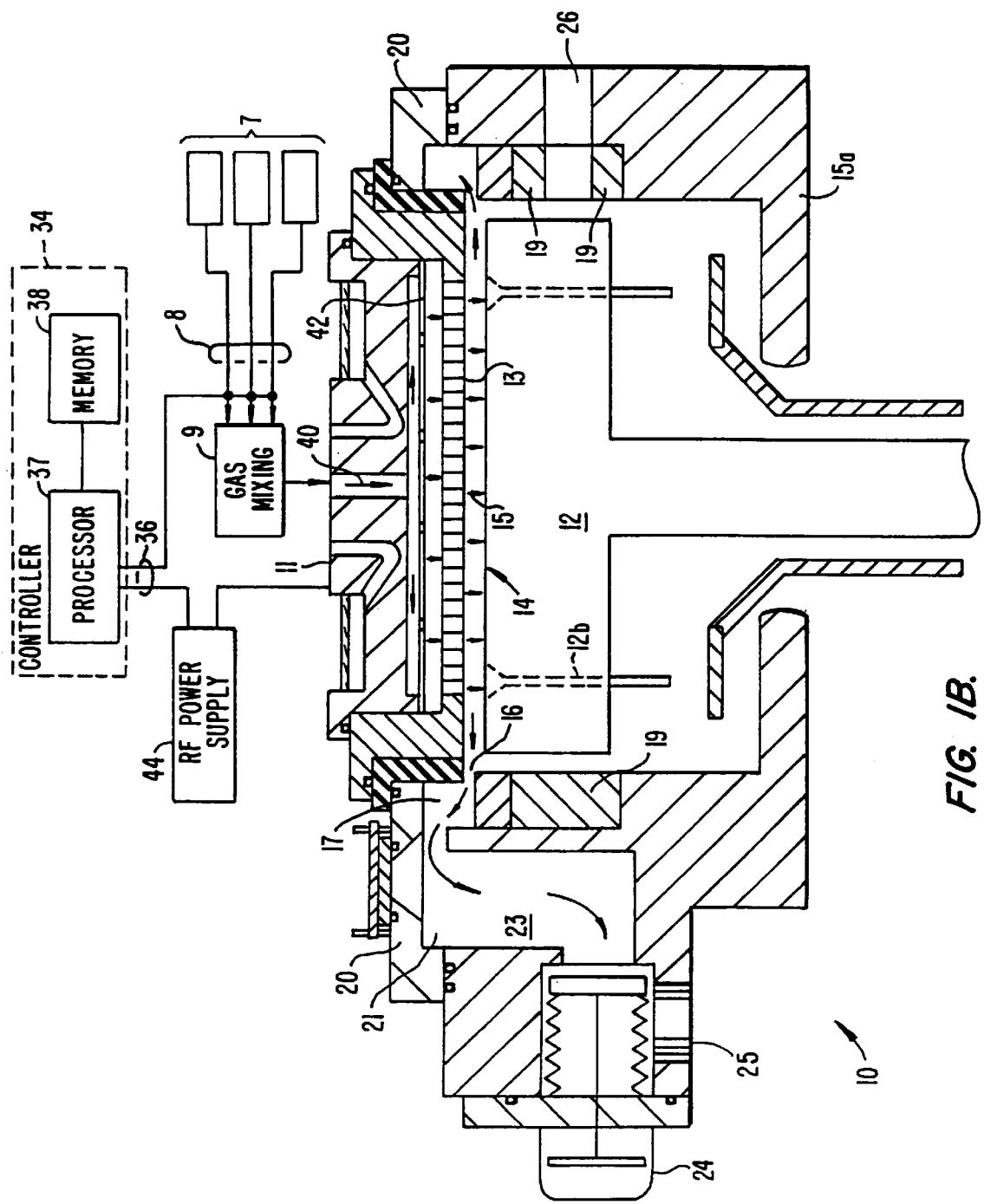
Figure 1C:
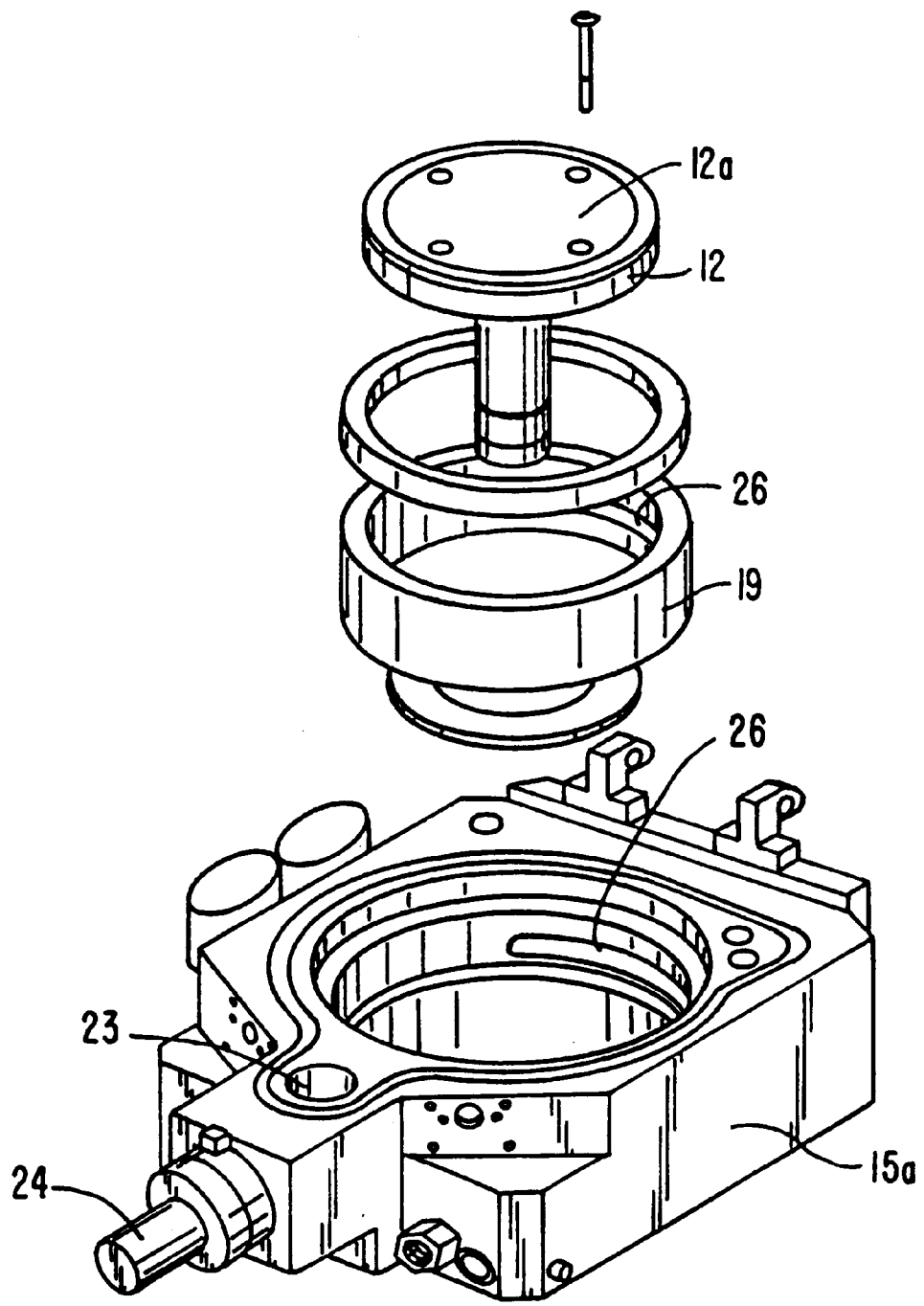
FIGS. 1C and 1D are exploded perspective views of parts of the CVD chamber depicted in FIG. 1A.
Figure 1D:
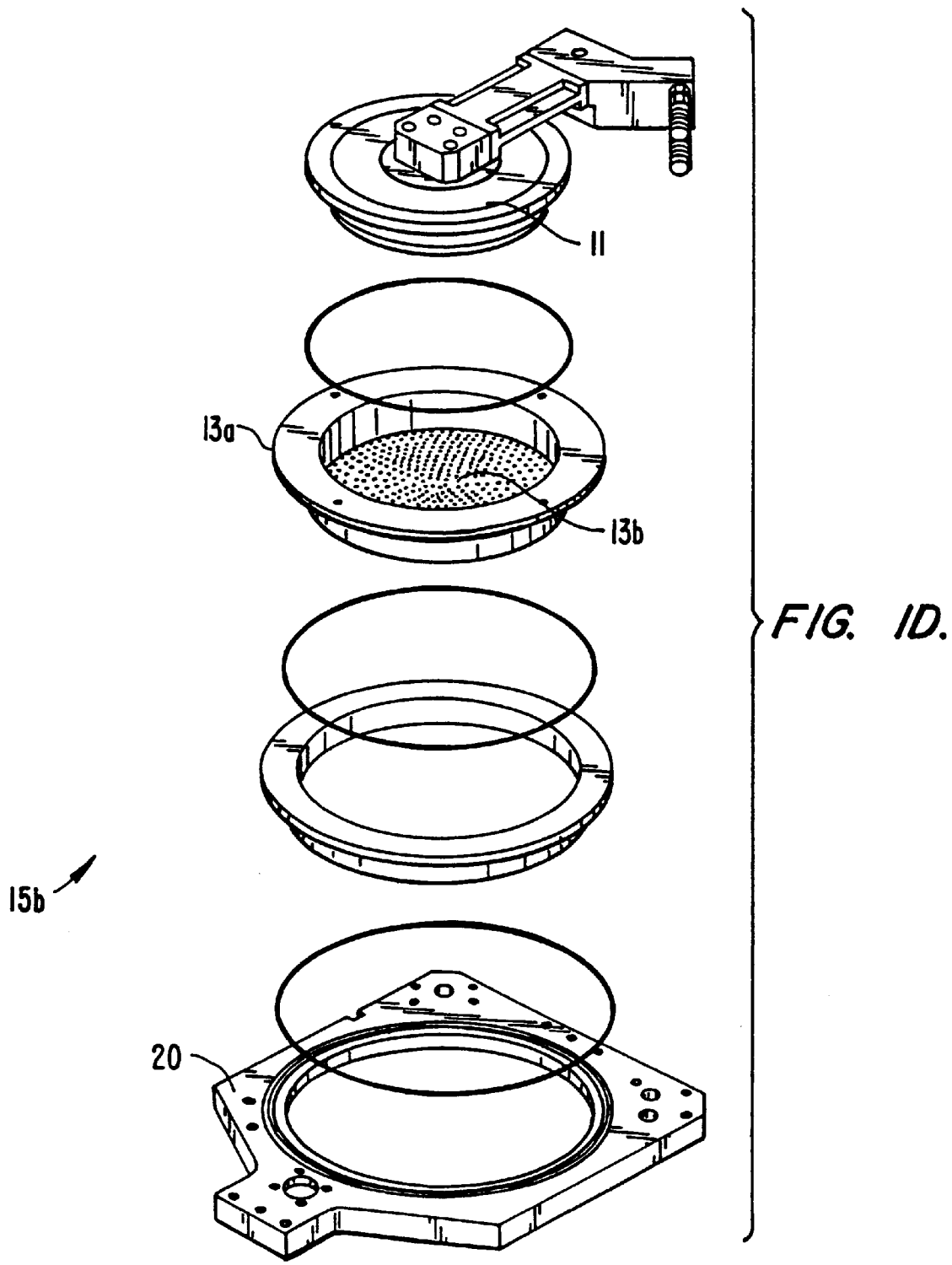

One suitable CVD apparatus in which the method of the present invention can be carried out is shown in FIGS. 1A and 1B, which are vertical, cross-sectional views of a CVD system 10, having a vacuum or processing chamber 15 that includes a chamber wall 15a and chamber lid assembly 15b. Chamber wall 15a and chamber lid assembly 15b are shown in exploded, perspective views in FIGS. 1C and 1D.

CVD system 10 contains a gas distribution manifold 11 for dispersing process gases to a substrate (not shown) that rests on a heated pedestal 12 centered within the process chamber. During processing, the substrate (e.g. a semiconductor wafer) is positioned on a flat (or slightly convex) surface 12a of pedestal 12. The pedestal can be moved controllably between a lower loading/off-loading position (depicted in FIG. 1A) and an upper processing position (indicated by dashed line 14 in FIG. 1A and shown in FIG. 1B), which is closely adjacent to manifold 11. A centerboard (not shown) includes sensors for providing information on the position of the wafers.

Deposition and carrier gases are introduced into chamber 15 through perforated holes 13b (FIG. 1D) of a conventional flat, circular gas distribution or faceplate 13a. More specifically, deposition process gases flow into the chamber through the inlet manifold 11 (indicated by arrow 40 in FIG. 1B), through a conventional perforated blocker plate 42 and then through holes 13b in gas distribution faceplate 13a.

Before reaching the manifold, deposition and carrier gases are input from gas sources 7 through gas supply lines 8 (FIG. 1B) into a mixing system 9 where they are combined and then sent to manifold 11. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in CVD system 10 can be either a thermal process or a plasma-enhanced process. In a plasma-enhanced process, an RF power supply 44 applies electrical power between the gas distribution faceplate 13a and the pedestal so as to excite the process gas mixture to form a plasma within the cylindrical region between the faceplate 13a and the pedestal. (This region will be referred to herein as the "reaction region"). Constituents of the plasma react to deposit a desired film on the surface of the semiconductor wafer supported on pedestal 12. RF power supply 44 may be a mixed frequency RF power supply that typically supplies power at a high RF frequency (RF1) of 13.56 MHz and at a low RF frequency (RF2) of 360 KHz. Alternatively, the power supply may only supply high frequency RF power at 13.56 MHz or low frequency RF power at 360 KHz. RF power supply 44 is used to enhance the decomposition of reactive species introduced into the vacuum chamber 15. In a thermal process, RF power supply 44 would not be utilized, and the process gas mixture thermally reacts to deposit the desired films on the surface of the semiconductor wafer supported on pedestal 12, which is resistively heated to provide thermal energy for the reaction.

During a plasma-enhanced deposition process, the plasma heats the entire process chamber 10, including the walls of the chamber body 15a surrounding the exhaust passageway 23 and the shut-off valve 24. When the plasma is not turned on or during a thermal deposition process, a hot liquid is circulated through the walls 15a of the process chamber to maintain the chamber at an elevated temperature. Fluids used to heat the chamber walls 15a include the typical fluid types, i.e., water-based ethylene glycol or oil-based thermal transfer fluids. This heating beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction products, is evacuated from the chamber by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The wafer support platter of the pedestal 12 (preferably aluminum, ceramic, or a combination thereof) is resistively-heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 12.

Typically, any or all of the chamber lining, gas inlet manifold faceplate, and various other reactor hardware are made out of material such as aluminum, anodized aluminum, or ceramic. An example of such a CVD apparatus is described in U.S. Pat. No. 5,558,717 entitled "CVD Processing Chamber," issued to Zhao et al. The U.S. Pat. No. 5,558,717 is assigned to Applied Materials, Inc., the assignee of the present invention, and is hereby incorporated by reference in its entirety.

A lift mechanism and motor 32 (FIG. 1A) raises and lowers the heater pedestal assembly 12 and its wafer lift pins 12b as wafers are transferred into and out of the body of the chamber by a robot blade (not shown) through an insertion/removal opening 26 in the side of the chamber 10. The motor 32 raises and lowers pedestal 12 between a processing position 14 and a lower, wafer-loading position. The motor, valves or flow controllers connected to the supply lines 8, gas delivery system, throttle valve, RF power supply 44, and chamber and substrate heating systems are all controlled by a system controller 34 (FIG. 1B) over control lines 36, of which only some are shown. Controller 34 relies on feedback from optical sensors to determine the position of movable mechanical assemblies such as the throttle valve and pedestal which are moved by appropriate motors under the control of controller 34.

In a preferred embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD machine. The system controller executes system control software, which is a computer program stored in a computer-readable medium such as a memory 38. Preferably, memory 38 is a hard disk drive, but memory 38 may also be other kinds of memory. The computer program includes sets of instructions that dictate the timing, mixture of gases, chamber pressure, chamber temperature, RF power levels, pedestal position, and other parameters of a particular process. Other computer programs stored on other memory devices including, for example, a floppy disk or other another appropriate drive, may also be used to operate controller 34.

Figure 1E:
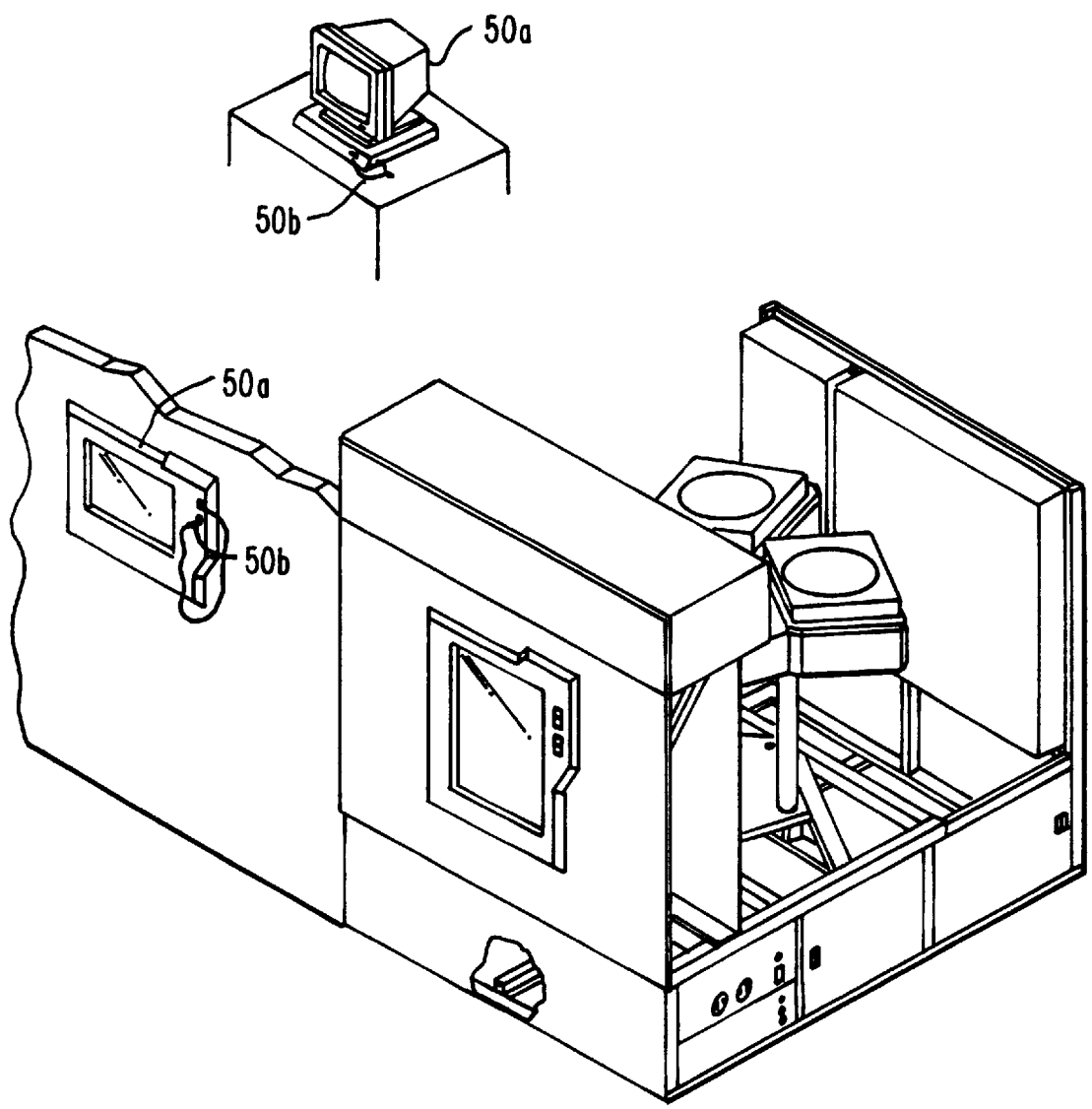
FIG. 1E is a simplified diagram of system monitor and CVD system in a multichamber system, which may include one or more chambers.

The interface between a user and controller 34 is via a CRT monitor 50a and light pen 50b, shown in FIG. 1E, which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. The monitors 50a simultaneously display the same information, but only one light pen 50b is enabled. A light sensor in the tip of light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller 34.

The process for depositing the film can be implemented using a computer program product that is executed by controller 34. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Windows™ library routines. To execute the linked, compiled object code the system user invokes the object code, causing the computer system to load the code in memory. The CPU then reads and executes the code to perform the tasks identified in the program.

Figure 1F:
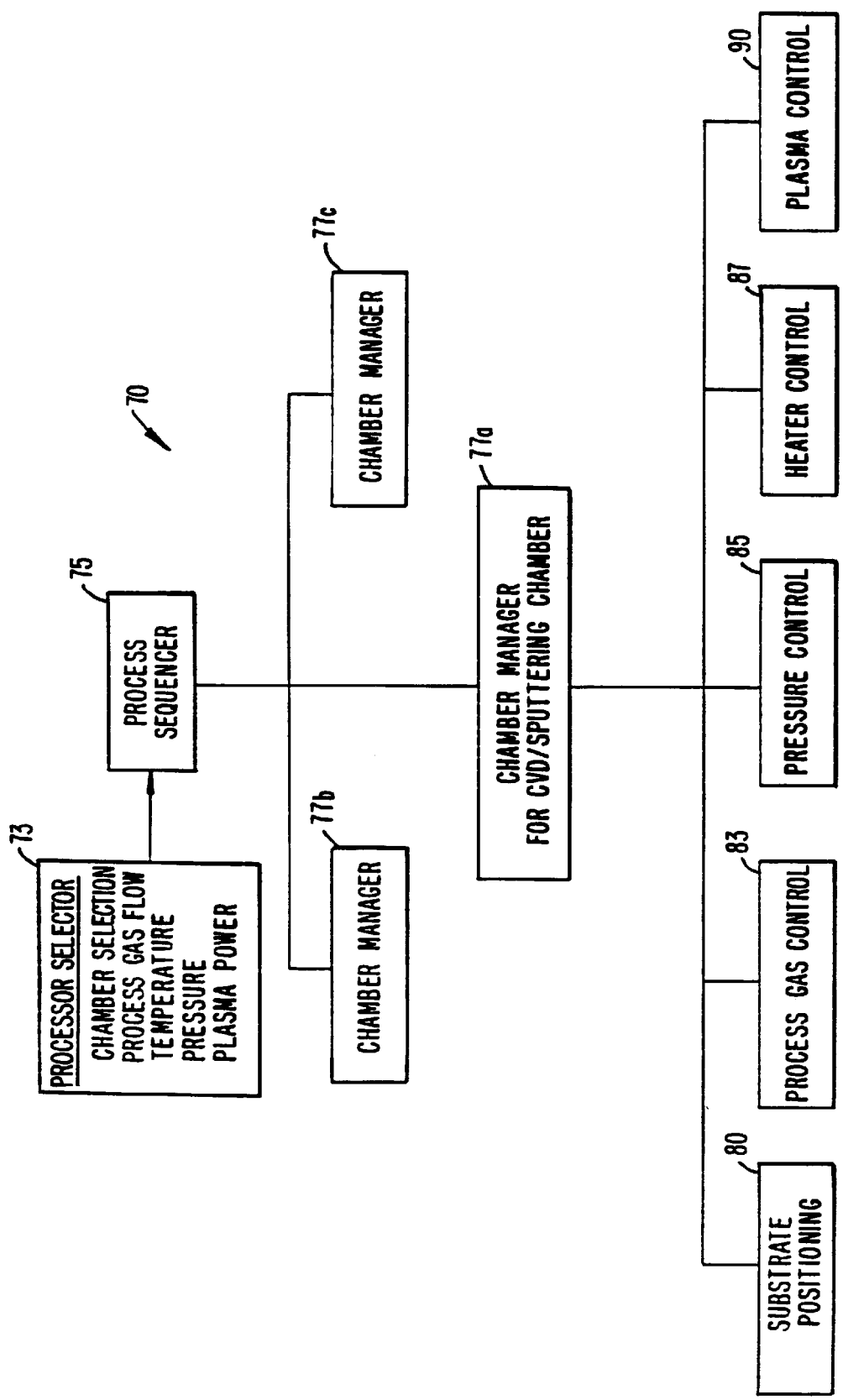
FIG. 1F shows an illustrative block diagram of the hierarchical control structure of the system control software, computer program 70, according to a specific embodiment.

FIG. 1F is an illustrative block diagram of the hierarchical control structure of the system control software, computer program 70, according to a specific embodiment. Using the light pen interface, a user enters a process set number and process chamber number into a process selector subroutine 73 in response to menus or screens displayed on the CRT monitor. The process sets are predetermined sets of process parameters necessary to carry out specified processes, and are identified by predefined set numbers. The process selector subroutine 73 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and are entered utilizing the light pen/CRT monitor interface.

The signals for monitoring the process are provided by the analog and digital input boards of the system controller, and the signals for controlling the process are output on the analog and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence.

Preferably, the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 initiates execution of the process set by passing the particular process set parameters to a chamber manager subroutine 77a–c, which controls multiple processing tasks in a process chamber 15 according to the process set determined by the sequencer subroutine 75. For example, the chamber manager subroutine 77a comprises program code for controlling sputtering and CVD process operations in the process chamber 15. The chamber manager subroutine 77 also controls execution of various chamber component subroutines that control operation of the chamber components necessary to carry out the selected process set.

Examples of chamber component subroutines are substrate positioning subroutine 80, process gas control subroutine 83, pressure control subroutine 85, heater control subroutine 87, and plasma control subroutine 90. Those having ordinary skill in the art will readily recognize that other chamber control subroutines can be included depending on what processes are to be performed in the process chamber 15. In operation, the chamber manager subroutine 77a selectively schedules or calls the process component subroutines in accordance with the particular process set being executed. The chamber manager subroutine 77a schedules the process component subroutines much like the sequencer subroutine 75 schedules which process chamber 15 and process set are to be executed next. Typically, the chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1F. The substrate positioning subroutine 80 comprises program code for controlling chamber components that are used to load the substrate onto pedestal 12 and, optionally, to lift the substrate to a desired height in the chamber 15 to control the spacing between the substrate and the gas distribution manifold 11. When a substrate is loaded into the process chamber 15, pedestal 12 is lowered to receive the substrate, and thereafter, the pedestal 12 is raised to the desired height in the chamber, to maintain the substrate at a first distance or spacing from the gas distribution manifold during the CVD process. In operation, the substrate positioning subroutine 80 controls movement of pedestal 12 in response to process set parameters related to the support height that are transferred from the chamber manager subroutine 77*a*.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77*a*, as are all chamber component subroutines, and receives from the chamber manager subroutine process parameters related to the desired gas flow rates. Typically, the process gas control subroutine 83 operates by opening the gas supply lines and repeatedly (i) reading the necessary mass flow controllers, (ii) comparing the readings to the desired flow rates received from the chamber manager subroutine 77*a*, and (iii) adjusting the flow rates of the gas supply lines as necessary. Furthermore, the process gas control subroutine 83 includes steps for monitoring the gas flow rates for unsafe rates and for activating the safety shut-off valves when an unsafe condition is detected.

In some processes, an inert gas such as helium or argon is flowed into the chamber 15 to stabilize the pressure in the chamber before reactive process gases are introduced. For these processes, the process gas control subroutine 83 is programmed to include steps for flowing the inert gas into the chamber 15 for an amount of time necessary to stabilize the pressure in the chamber, and then the steps described above would be carried out. Additionally, when a process gas is to be vaporized from a liquid precursor, for example, tetraethylorthosilane ("TEOS"), the process gas control subroutine 83 is written to include steps for bubbling a delivery gas, such as helium, through the liquid precursor in a bubbler assembly or introducing a carrier gas, such as helium or nitrogen, to a liquid injection system. When a bubbler is used for this type of process, the process gas control subroutine 83 regulates the flow of the delivery gas, the pressure in the bubbler, and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in the chamber 15 by regulating the size of the opening of the throttle valve in the exhaust system of the chamber. The size of the opening of the throttle valve is set to control the chamber pressure to the desired level in relation to the total process gas flow, size of the process chamber, and pumping setpoint pressure for the exhaust system. When the pressure control subroutine 85 is invoked, the desired, or target, pressure level is received as a parameter from the chamber manager subroutine 77*a*. The pressure control subroutine 85 operates to measure the pressure in the chamber 15 by reading one or more conventional pressure manometers connected to the chamber, to compare the measure value(s) to the target pressure, to obtain PID (proportional, integral, and differential) values from a stored pressure table corresponding to the target pressure, and to adjust the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the current to a heating unit that is used to heat the substrate 20. The heater control subroutine 87 is also invoked by the chamber manager subroutine 77*a* and receives a target, or set-point, temperature parameter. The heater control subroutine 87 measures the temperature by measuring voltage output of a thermocouple located in pedestal 12, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When an embedded loop is used to heat pedestal 12, the heater control subroutine 87 gradually controls a ramp up/down of current applied to the loop. Additionally, a built-in fail-safe mode can be included to detect process safety compliance, and can shut down operation of the heating unit if the process chamber 15 is not properly set up.

The plasma control subroutine 90 comprises program code for setting the low and high frequency RF power levels applied to the process electrodes in the chamber 15, and for setting the low frequency RF frequency employed. Similar to the previously described chamber component subroutines, the plasma control subroutine 90 is invoked by the chamber manager subroutine 77*a*.

The above reactor description is mainly for illustrative purposes, and other plasma CVD equipment such as electron cyclotron resonance (ECR) plasma CVD devices, induction coupled RF high density plasma CVD devices, or the like may be employed. Additionally, variations of the above-described system, such as variations in pedestal design, heater design, RF power frequencies, location of RF power connections and others are possible. For example, the wafer could be supported by a susceptor and heated by quartz lamps. The layer and method for forming such a layer of the present invention is not limited to any specific apparatus or to any specific plasma excitation method.

III. Depositing a Stable FSG Layer

Figure 2A:
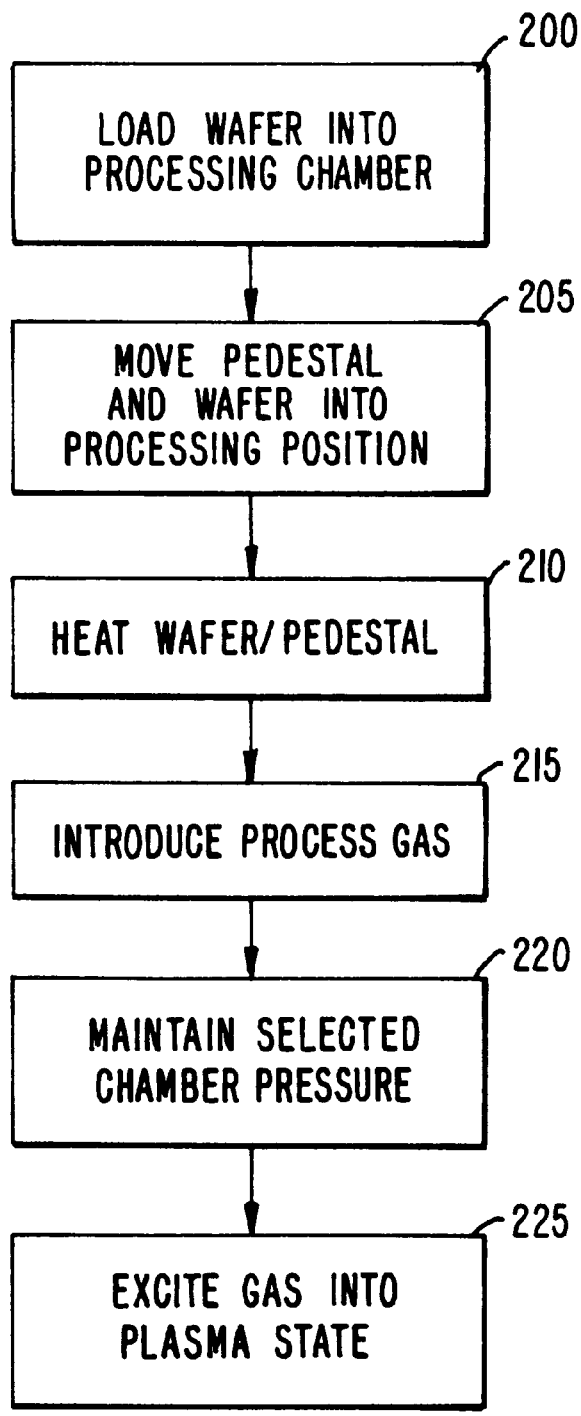
FIGS. 2A–2B are flow charts illustrating process steps in the formation of an insulating layer according to preferred embodiments of the method according to the present invention.

To form the insulating film according to the present invention, a wafer is loaded in vacuum chamber 15 through a vacuum-lock door and placed onto pedestal 12 (FIG. 2A, step 200). The pedestal is then moved into processing position 14 (step 205). In processing position 14, the wafer is positioned about 300–600 mils from gas distribution manifold 11.

Once the wafer is properly positioned, the wafer and pedestal are heated to a temperature of about 200–450° C. and a process gas is introduced into the processing chamber from the gas distribution manifold (steps 210 and 215). The process gas is a mixture comprising $SiF_4$ as the gaseous source of fluorine, $SiH_4$ as the gaseous source of silicon, $N_2O$ as the gaseous sources of oxygen, and $N_2$ gas as the gaseous source of nitrogen.

$SiH_4$ is introduced into the processing chamber at a lower flow rate of about 10–30 sccm, and a upper flow rate of about 450–500 sccm. $SiF_4$ is introduced into the processing chamber at a lower flow rate of about 5–15 sccm, and a upper flow rate of about 800–1000 sccm. $N_2O$ is introduced into the processing chamber at a lower flow rate of about 10–30 sccm, and a upper flow rate of about 3800–4000 sccm. $N_2$ is introduced into the processing chamber at a lower flow rate of about 100–300 sccm, and a upper flow rate of about 2700–3000 sccm. In addition, helium (He) may be used as a carrier gas. If used, He is introduced into the processing chamber at a lower flow rate of about 10–30 sccm, and a upper flow rate of about 2700–3000 sccm. Of course, the above gases could be introduced into the chamber at flow rates in between the aforementioned upper and lower flow rates.

The preferred ratio of $N_2$ to $SiF_4$ is between about 4–5:1, with the preferred value being about 4.4:1. The preferred ratio of $N_2$ to $SiH_4$ is between about 3.2–4.5:1, with the preferred value being about 3.8:1. In addition, the preferred ratio of $N_2$ to $N_2O$ is between about 1:1–3, with the preferred ratio being about 1:2.

The chamber is maintained at a pressure of about 1–6 torr (step 220), and the process gas is excited into a plasma state through the use of a single RF power supply (13.56 MHz) at about 100–2000 W (step 225). The deposition rate of the process is at least about 1.5 $\mu$m/min. The result of this high deposition rate process is a stable insulating film having a reduced dielectric constant.

As an alternative to step 215 where all constituents of the process gas are introduced simultaneously, preferred embodiments of the present invention employ a strict sequence in which the constituents are introduced. In these embodiments, $SiF_4$ is not introduced at step 215; instead, it is introduced when the wafer has been heated to the desired process temperature, which corresponds to step 225 when the RF power is turned on to strike a plasma. Such a process sequence minimizes reactions that may occur between $SiF_4$ and $SiH_4$ before the plasma is initiated, thereby preventing the formation of HF before the plasma is initiated. Although the formation of HF during deposition (i.e., after the plasma has been initiated) helps reduce the amount of free or loosely bonded fluorine in the film, HF that formed before the plasma is initiated may become polarized when the plasma is initiated. When polarized, HF tends to form residue on the film thereby affecting the stability and adhesive characteristic of the film. Hence, the above process sequence further improves the quality and stability of the film by eliminating the formation of HF residue on the film.

Figure 2B:
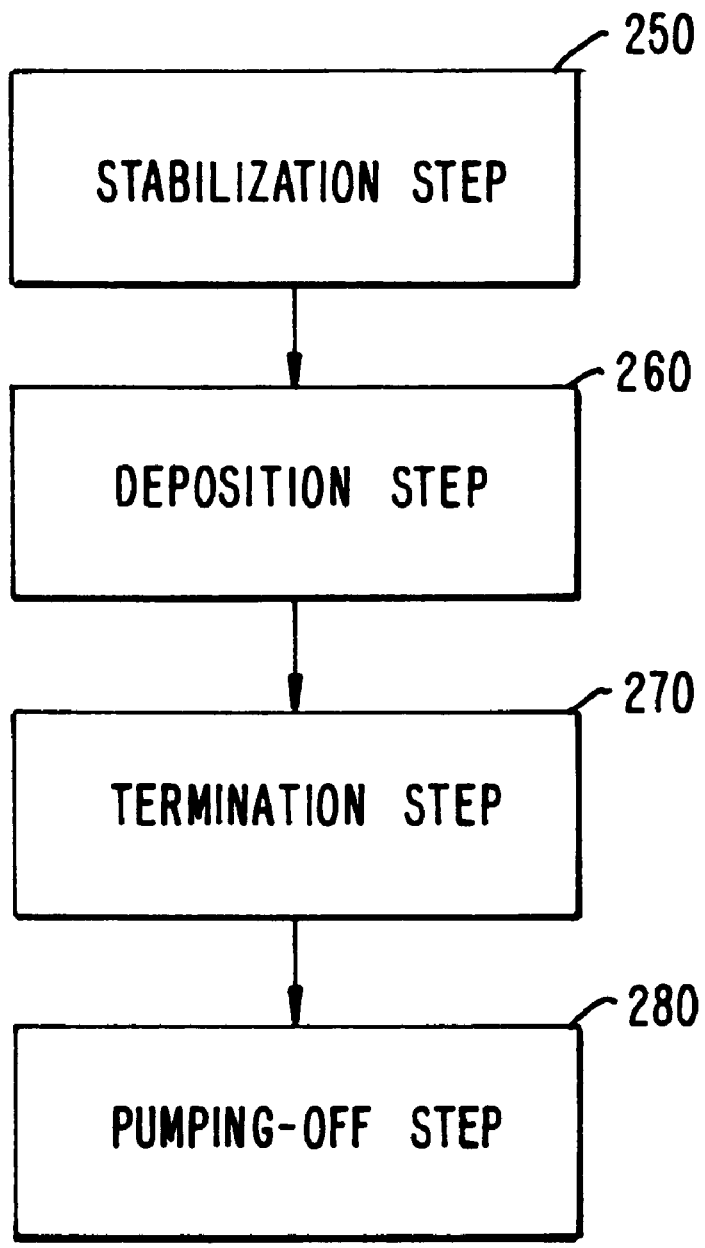

Referring to FIG. 2B, in a preferred embodiment of the method of the present invention, the deposition process includes four steps. As shown, the first process step is stabilization step 250, which includes steps 210 to 220 of FIG. 2A. After stabilization step 250 is deposition step 260, which includes step 225 of FIG. 2A and the deposition of the film. In conventional methods, a pumping-off step 280, during which the RF power is turned off, the gas flow into the chamber ceases, and the gases in the chamber are pumped out of the chamber, follows deposition step 260. According to a preferred embodiment of the method of the present invention, however, termination step 270 stops $SiF_4$ flow into the processing chamber 2–3 seconds prior to the stoppage of other gas flows into the chamber in pumping-off step 280. Tests have shown that some FSG films deposited in this manner exhibit no fluorine, HF, or $H_2O$ outgassing when heated up to at least 700° C.

Stopping the $SiF_4$ flow into the chamber before stopping the other gas flows reduces the formation of loosely bonded fluorine on the surface of the film and thus further improves the stability of the deposited FSG film. FSG and other halogen-doped silicon oxide films deposited according to the present invention can include up to at least 7 percent SiF (as measured by Fourier transform infrared (FTIR) spectroscopy of the peak height ratio of SiF bonds to SiF+SiO bonds) and can incorporate up to at least 16 at. % fluorine as measured using SIMS while exhibiting no significant fluorine, HF, or $H_2O$ outgassing up to temperatures of at least 475° C. or 700° C. depending on the deposition method employed as described above. The dielectric constant of the film is about 3.3–3.5 as measure by the C-V curve at 1 MHz in the metal insulator semiconductor (MIS) structure, and the deposition rate of the process is generally between 1.5 and 1.8 $\mu$m/min.

FIG. 2C shows the effect of the various parameters of the process on the doping efficiency, the deposition rate, and the quality of the film. It can be seen that as the pressure increases, the doping efficiency and the quality of the film also increase, while the deposition rate deceases. As the spacing between the substrate and the gas distribution center increases, the doping efficiency increases while the deposition rate and the quality of the film decrease. An increase in the high RF power corresponds to increases in the doping efficiency, the deposition rate, and the quality of the film. In contrast, an increase in the low RF power has no effect on the film. This is not surprising as the low RF power is ineffective in breaking up $SiF_4$ bonds. Hence, the present invention only uses the high RF power.

FIG. 2C further shows that an increase in temperature corresponds to an increase in the doping efficiency, the deposition rate, and the quality of the film. In addition, as $SiF_4$ flow increases, the doping efficiency increases, since more fluorine is introduced. The deposition rate is unaffected (showing $SiF_4$ as being suitable for high deposition rate processes, since the increased fluorine content does not in turn etch the film more), and the quality of the film decreases (stability decreases as fluorine content increases). As shown, an increase in $SiH_4$ or $N_2O$ corresponds to an increase in the deposition rate. However, the doping efficiency and the quality of the film decreases. Hence, the addition of $N_2$ to the process is desirable as the quality of the film increases as $N_2$ flow increases. The deposition rate is unaffected with the increase of $N_2$ flow (since $N_2$ is an inert gas), while the doping efficiency decreases as $N_2$ flow increases.

Although $N_2$ is the preferred source of nitrogen, other nitrogen sources such as ammonia ($NH_3$) may also be used in the process gas for reacting with the free or loosely bonded fluorine. It is believed that $NH_3$ may be a more efficient nitrogen source than $N_2$ because the hydrogens in $NH_3$ can also react with fluorine to form HF. Since HF is also a volatile gas, it may be pumped out of the chamber, along with $NF_2$ and $NF_3$, during and after the deposition has completed. It is believed that $N_2O$ is a less desirable nitrogen source because a relatively high amount of energy is required to break the NO bonds. Less energy is required to break the $N_2$ bonds for reaction with fluorine to form $NF_2$ or $NF_3$.

In a most preferred embodiment, a highly stable FSG film is deposited under the following preferred conditions: the chamber pressure is maintained at 3.7 torr, the spacing of the pedestal from the gas distribution center is 400 mil, $SiH_4$ is introduced into the chamber at a rate of 260 sccm, $N_2O$ is introduced into the chamber at a rate of 3000 sccm, $N_2$ is introduced into the chamber at a rate of 1000 sccm, and He is introduced into the chamber at a rate of 1000 sccm. The process gas is then excited into a plasma state using a high RF power of 1500 W, and $SiF_4$ is introduced into the chamber at a rate of 225 sccm.

Figure 3A:
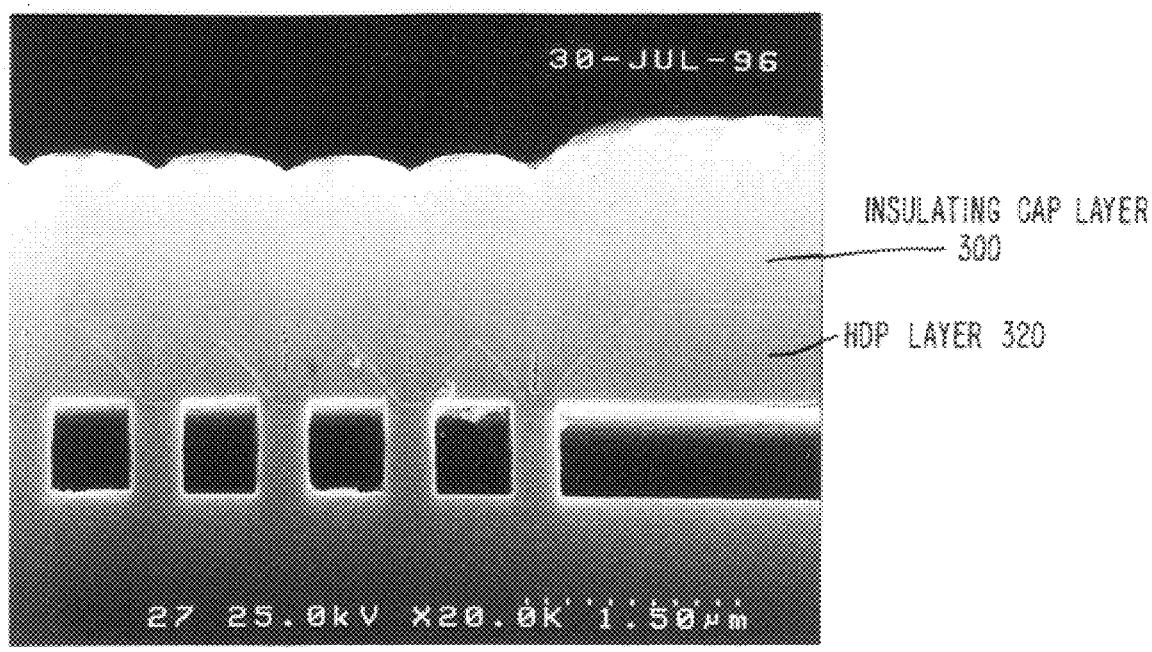
FIGS. 3A–3B are simplified cross-sectional views of an insulating film deposited as a cap layer according to the present invention.

The physical characteristics of FSG and other halogen-doped silicon oxide films of the present invention, with their low dielectric constant, high deposition rate and high stability, make such films particularly useful as capping layers for an HDP CVD or spin-on-glass (SOG) low k gap fill layer in an IMD layer, and as insulating layers in a damascene process. Referring now to FIG. 3A, an insulating layer 300 deposited as a cap layer according to the present invention is shown. Insulating layer 300 is shown to be deposited over high density plasma (HDP) layer 320. As discussed, insulating layer 300 is stable, has good adhesive qualities and a low dielectric constant, and is deposited at a high deposition rate. Hence, it is suitable for use in a high throughput process as an IMD cap layer where subsequently deposited metal layers, including titanium layers, are deposited over the cap layer. High stability is required for such a layer or the fluorine within the layer could react with the metal layer. The gap-fill capability of insulating layer 300 in this application is not critical as HDP layer 320 has good gap-fill capability.

In HDP-CVD reactors, inductively coupled coils are employed to generate the plasma under very low pressure conditions (in the millitorr range). A plasma generated by such an HDP-CVD reactor has an ion density approximately two orders of magnitude (or more) greater than the ion density of a standard, capacitively coupled PECVD plasma. It is believed that the low chamber pressure employed in HDP-CVD reactors provides active species having a long mean free path. This factor, in combination with the density of the plasma, permits a significant number of plasma constituents to reach even the bottom portions of deep, tightly spaced gaps, and deposits a film with excellent gap-fill properties. Also, argon or a similar heavy inert gas is introduced into the reaction chamber to promote sputtering during deposition. It is believed that the sputtering element of HDP deposition etches away deposition on the sides of gaps being filled, which also contributes to the increased gap-fill of HDP-deposited films.

Figure 3B:
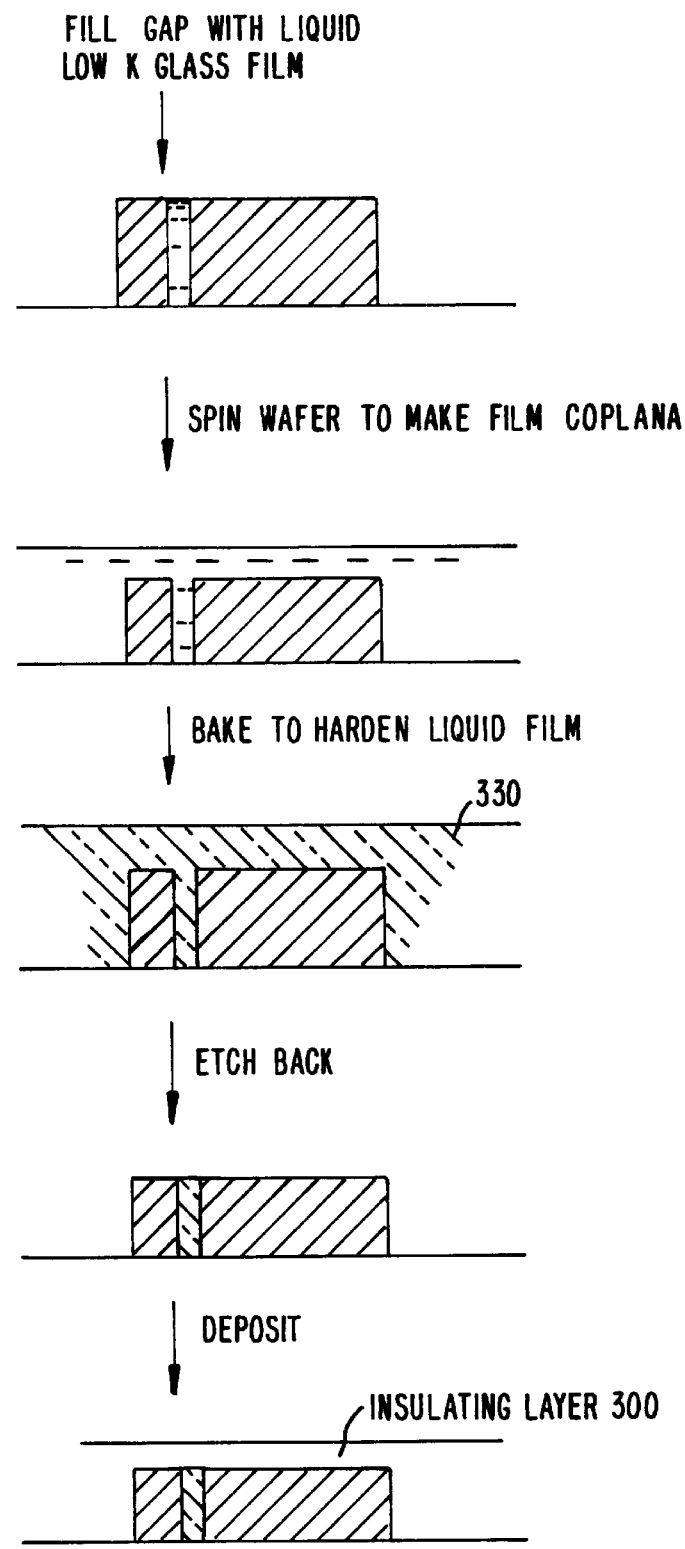

Similarly, insulating layer 300 may also be deposited as a cap layer over SOG low k film as shown in FIG. 3B. As can be seen, a SOG low k film is deposited according to the following steps: liquid low k glass film is poured over the metal lines to fill the narrow gaps between the metal lines and spun to make the liquid film co-planar. The film is then baked to harden the film, and the portion of the SOG low k layer 330 above the metal lines is etched after the film has hardened. Insulating layer 300 is deposited as a cap layer over the metal lines after layer 330 has been etched, hence the gap-fill capability of insulating layer 300 is not critical. Insulating layer 300 is preferred as an IMD layer over SOG low k layer 330 as insulating layer 300 is more stable. SOG low k layer 330, being liquid in nature, contains more moisture than insulating layer 300 although it has been baked to harden.

Figure 3C:
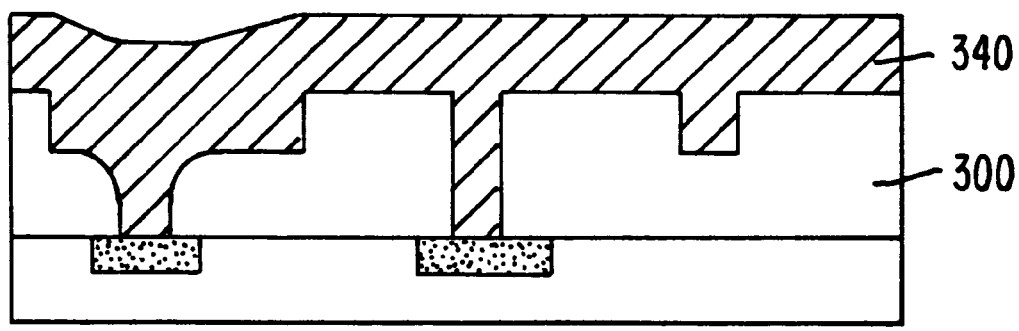
FIGS. 3C–3D are simplified cross-sectional views of an insulating film deposited according to the present invention in a damascene process.
Figure 3D:
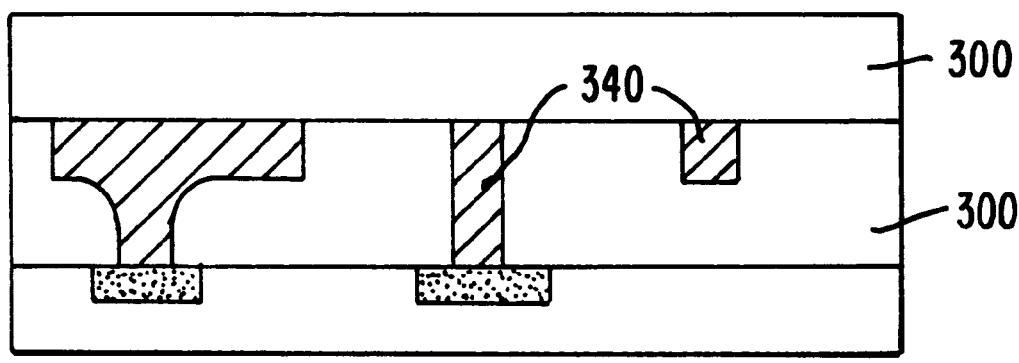

In another embodiment, the FSG layer of the present invention may be used as insulating film 300 in a damascene process. Referring to FIG. 3C, in a damascene process, the insulating layer 300 is deposited first, and subsequently etched to allow the deposition of metal layer 340 over the etched and un-etched portion of insulating layer 300. Metal layer 340 is then etched back to form metal lines 340. As shown in FIG. 3D, insulating layer 300 may be deposited as a cap layer over metal lines 340. Alternatively, it may be an intermediate insulating layer, to be subsequently etched to allow deposition of additional metal layers.

Figure 4A:
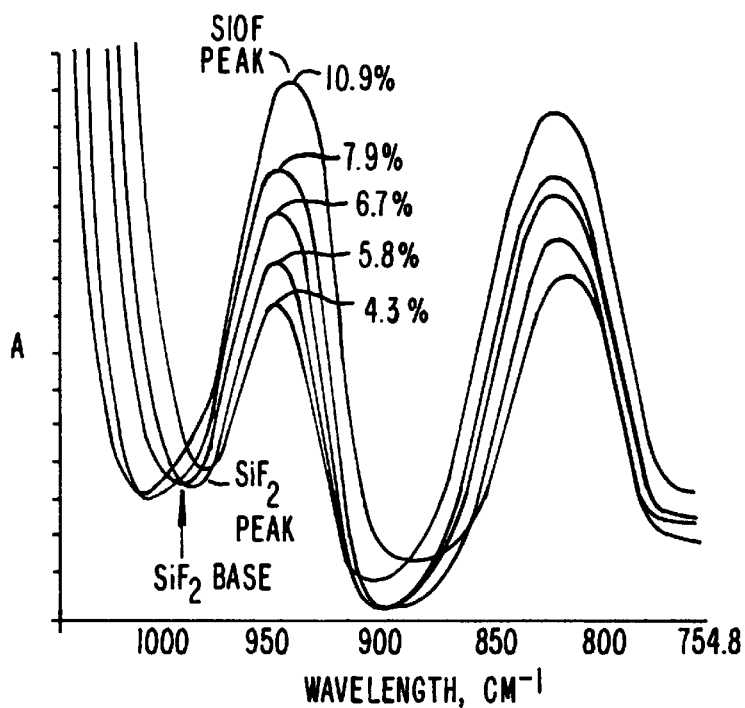
Figure 4B:
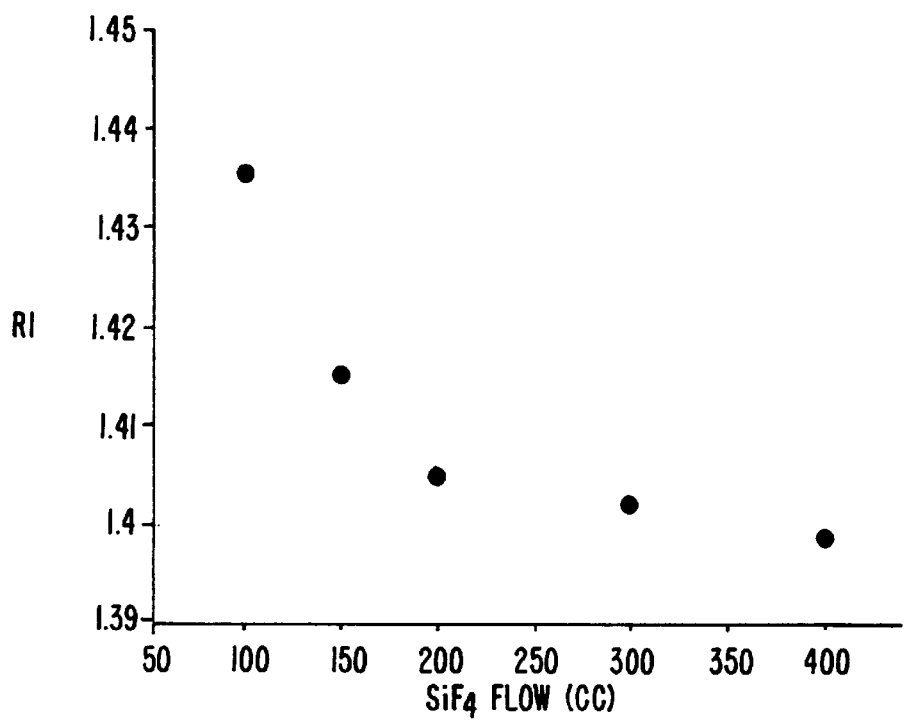

FIGS. 4A–4L are test results that show the effect of increasing fluorine concentration in the insulating layer on the stability of the layer. The amount of fluorine in the films may be monitored using the refractive index (RI) of the films. The higher the RI of the film, the lower the fluorine content of the film. FIG. 4A shows the Fourier Transform Infrared (FTIR) spectrums for the different FSG layers deposited under the different $SiF_4$ flows. FIG. 4B shows the RI of the FSG film as a function of $SiF_4$ flow, and correlates the $SiF_4$ flow with the FTIR peak ratio.

As shown in FIG. 4B, the RI of the FSG film decreased as the fluorine flow increased, which translates to an increase in the fluorine content of the film. As can be seen from FIGS. 4A and 4B, the SiOF peak, which indicates the fluorine content in the film, increased as the $SiF_4$ flow increased from 100 sccm to 400 sccm. The undesirable free or loosely bonded fluorine can be detected by the existence of the $SiF_2$ peak in the spectrum. FIGS. 4A–4B show that under the conditions stated above, the maximum amount of fluorine that can be doped into the film, without the presence of $SiF_2$, is 7% by FTIR peak ratio, which corresponds to an RI value of 1.406 and a $SiF_4$ flow of about 230 sccm.

The effect of power, chamber pressure, and $SiF_4$ flow on the efficiency of fluorine doping into the FSG film was studied based on 1 $\mu$m thick sample films prepared under the following conditions: the chamber pressure was maintained at about 3.7 torr, the spacing of the pedestal from the gas distribution center was about 400 mil, $SiH_4$ was introduced into the chamber at a rate of about 260 sccm, $N_2O$ was introduced into the chamber at a rate of about 3000 sccm, $N_2$ was introduced into the chamber at a rate of about 1000 sccm, and the process gas was excited into a plasma state at a high RF power of about 1500 W. The rate at which $SiF_4$ was introduced into the chamber was varied from 100 to 300 sccm, the power was varied from 700 to 1500 W, and the chamber pressure was varied from 3.5 to 5 torr.

FIG. 4C shows the fluorine content of the film as a function of power and $SiF_4$ flow. As can be seen, the RI of the film decreased as $SiF_4$ flow and power increased, hence, the fluorine content of the film increases as $SiF_4$ flow and power increases.

Figure 4D:
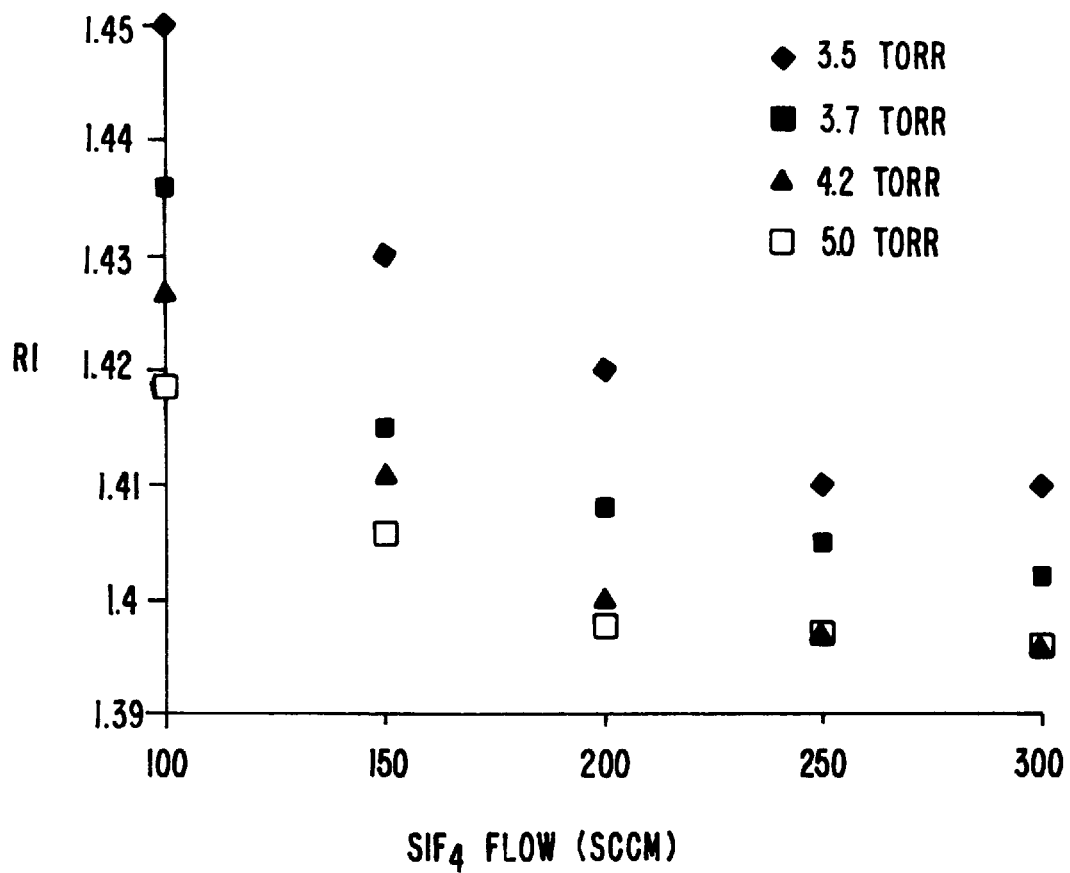

FIG. 4D shows the fluorine content of the film as a function of pressure and $SiF_4$ flow. As can be seen, the RI of the film decreased as $SiF_4$ flow and pressure increased, but unlike power, this relationship is not linear. At about 250 sccm of $SiF_4$ flow, the fluorine content saturated and remained substantially constant regardless of fluorine flow.

Figure 4E:
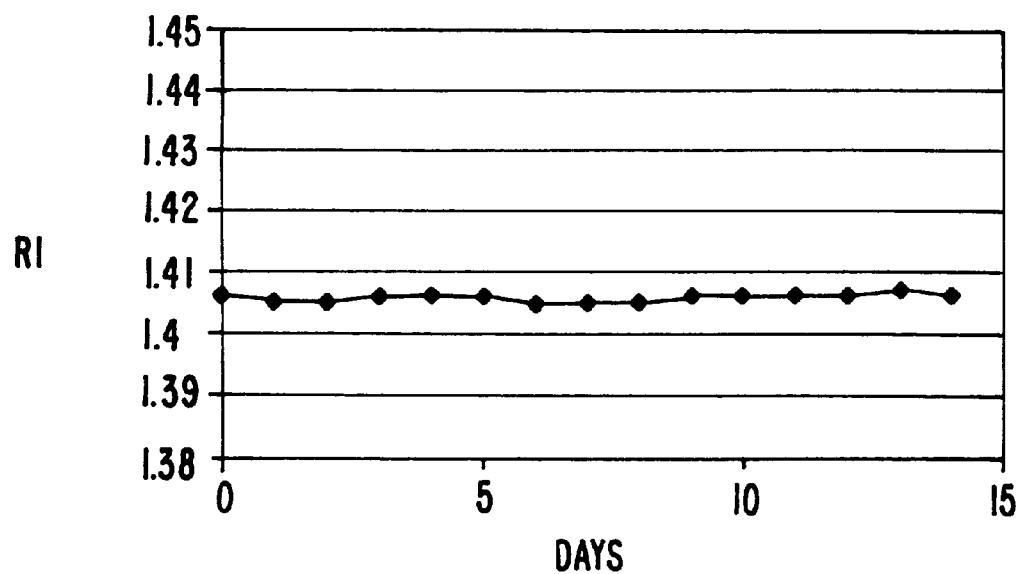
Figure 4E:
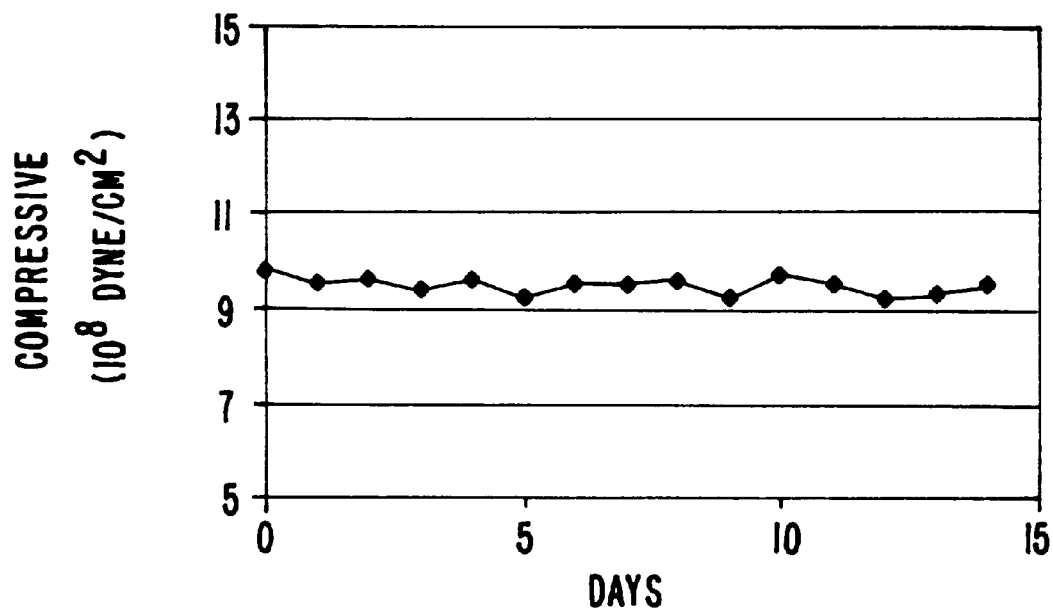

FIG. 4E shows the RI and stress of the 1 $\mu$m film over a 14 day period in the clean room. Since the RI and stress of the film remained relatively constant, this shows that the film is stable.

Figure 4F:
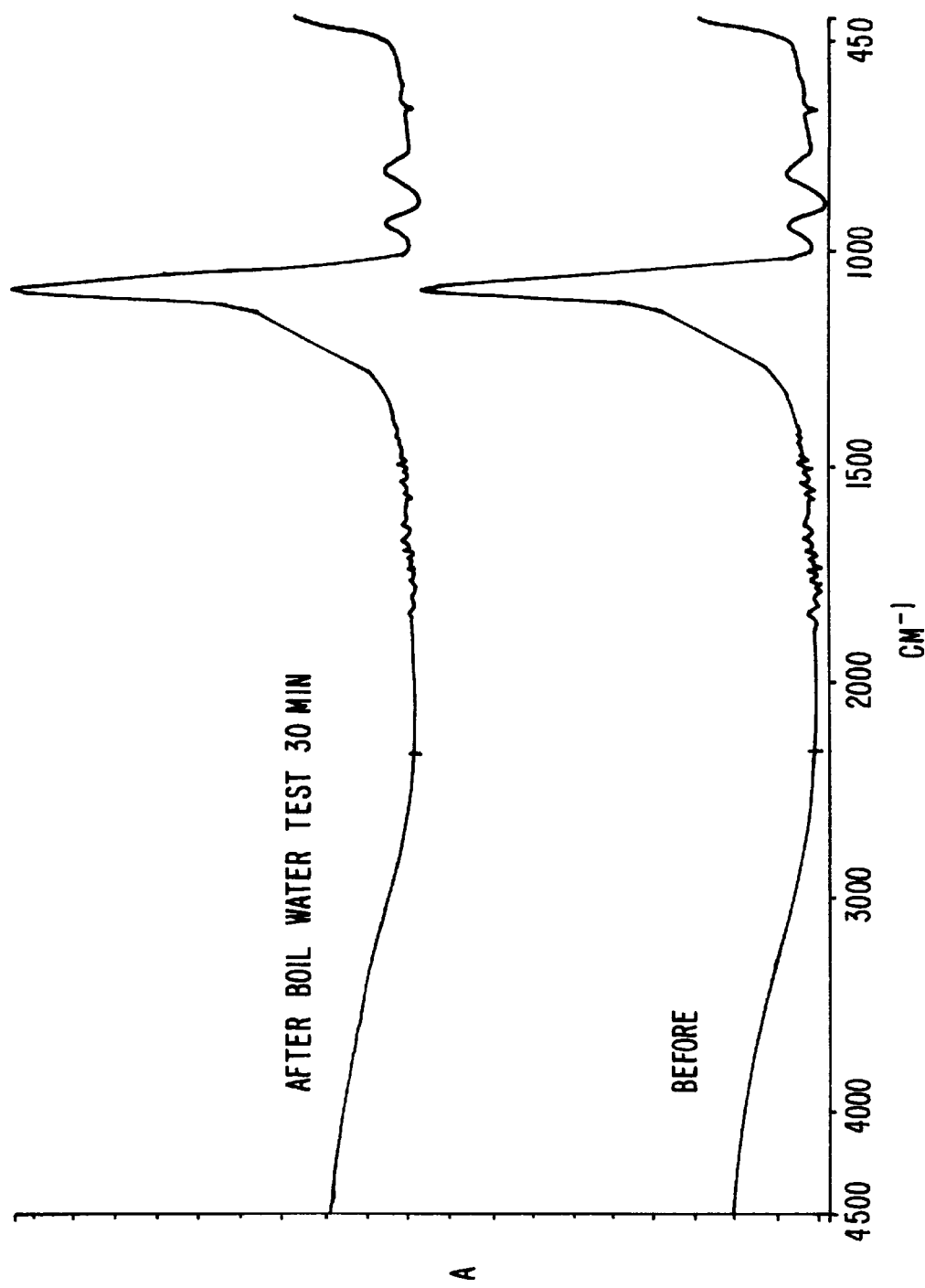

FIG. 4F shows the FTIR spectrums of the film after it was boiled in water for 30 minutes. Since the FTIR spectrum after the water test showed no formation of H—O—H bond, the spectrum shows that the film is stable.

Figure 4G:
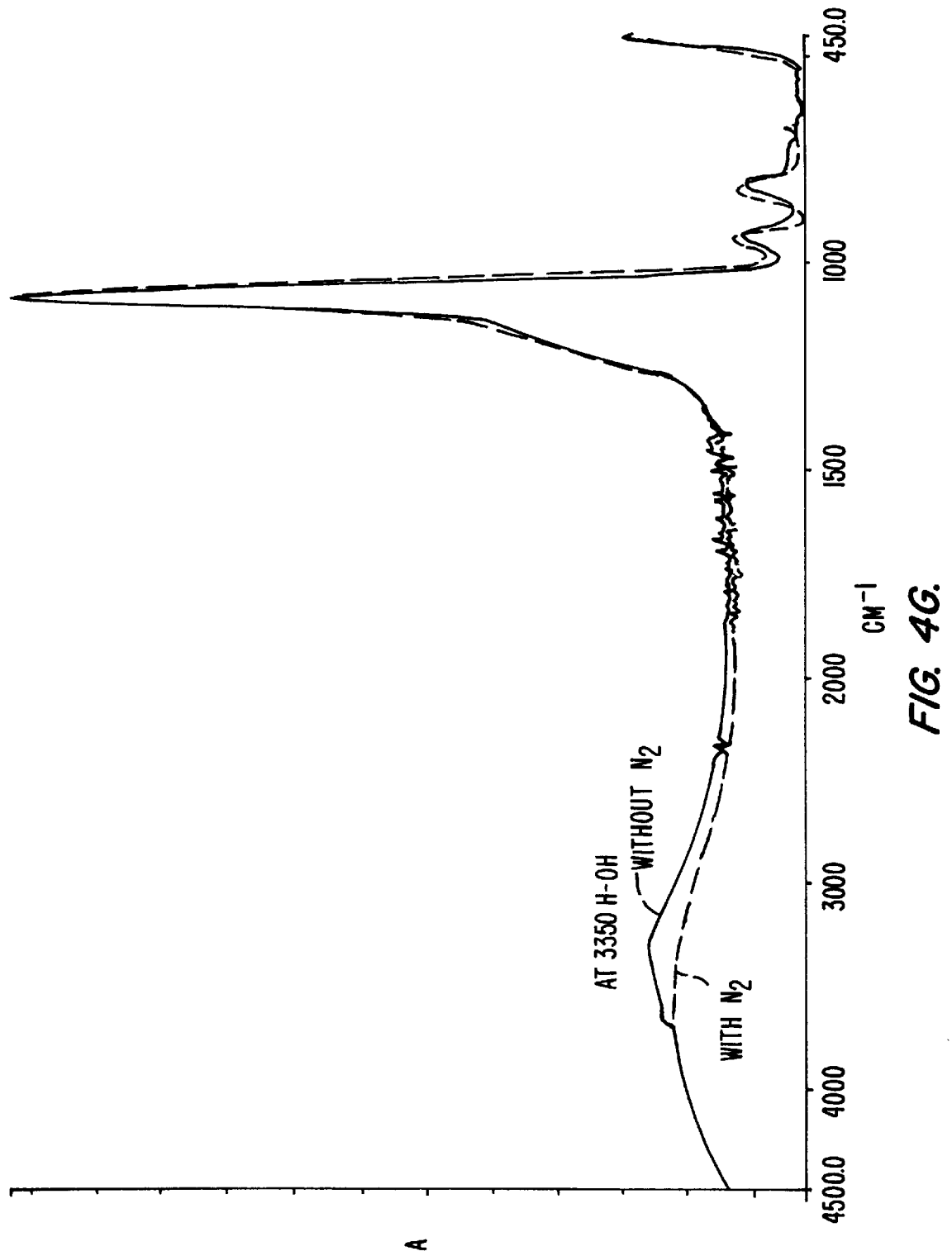

FIG. 4G further contrasts the stability of a film deposited with $N_2$ with one deposited without $N_2$ after the films have undergone the boil water test. As can be seen, the film deposited without $N_2$ is unstable as its FTIR spectrum showed the formation of H—O—H bonds at around 3350 cm-1. Hence, FIG. 4G confirms that the use of $N_2$ further improves the film stability.

Figure 4H:
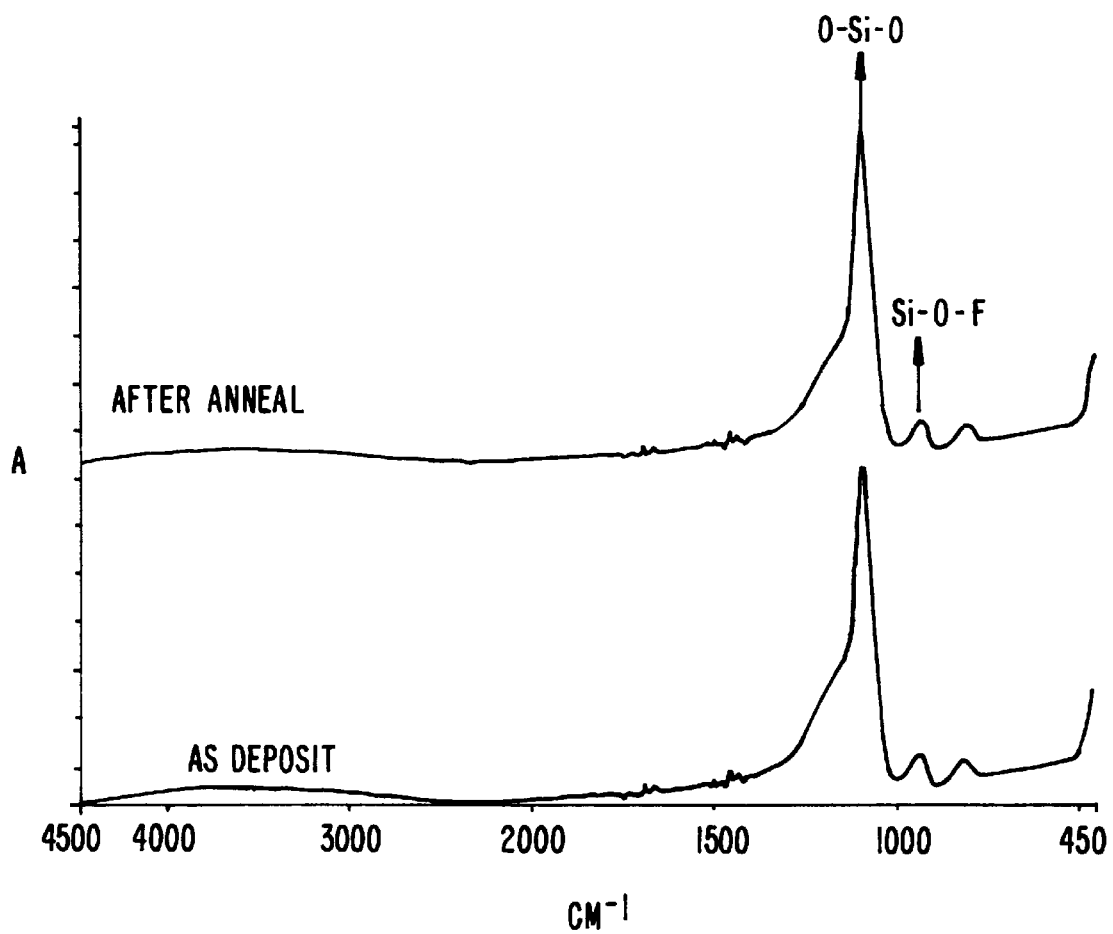

FIG. 4H shows the FTIR of the film before and after the film underwent annealing at 450° C. for 30 minutes. The annealing test was conducted for compatibility with the integration process. As shown in FIG. 4H, the Si-O-F peak did not change, i.e., the film did not lose fluorine content. Hence, the film is stable.

Figure 4I:
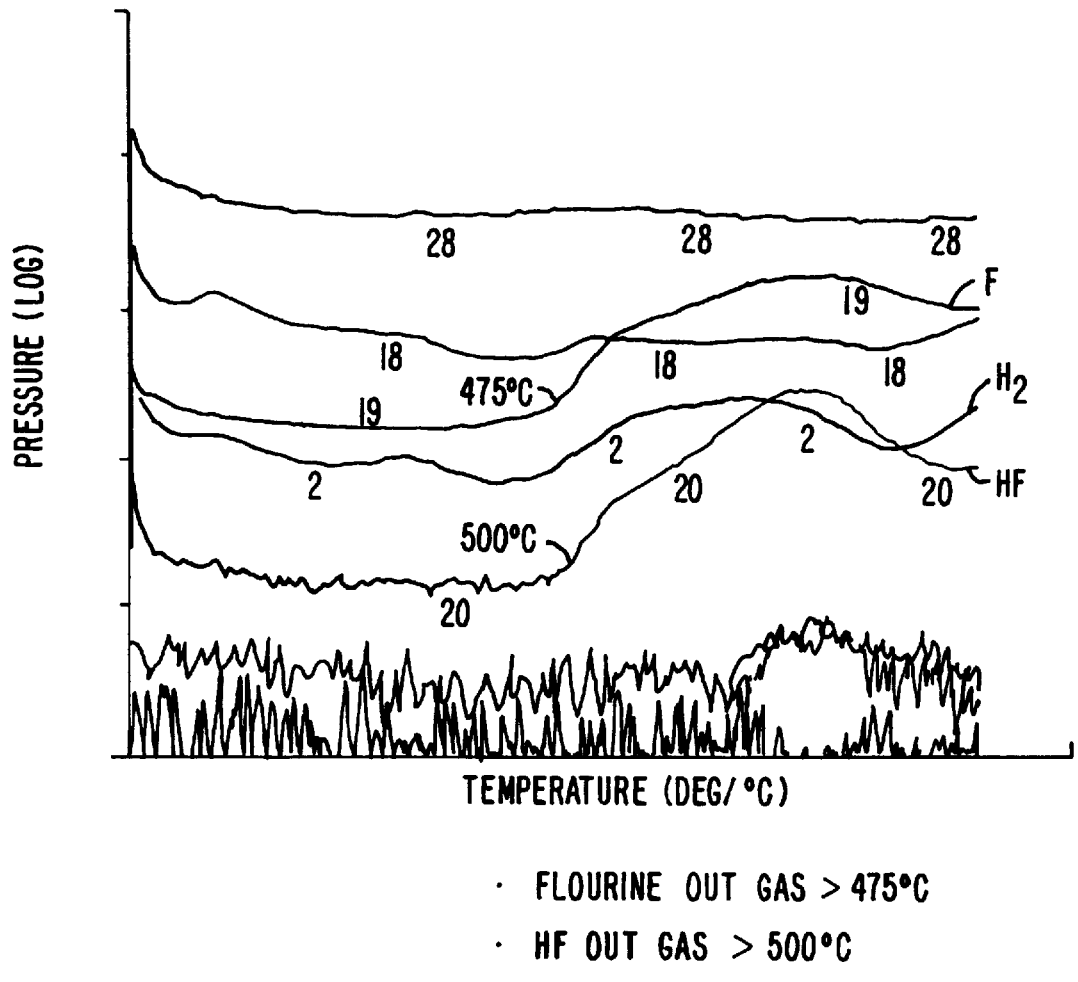
Figure 4J:
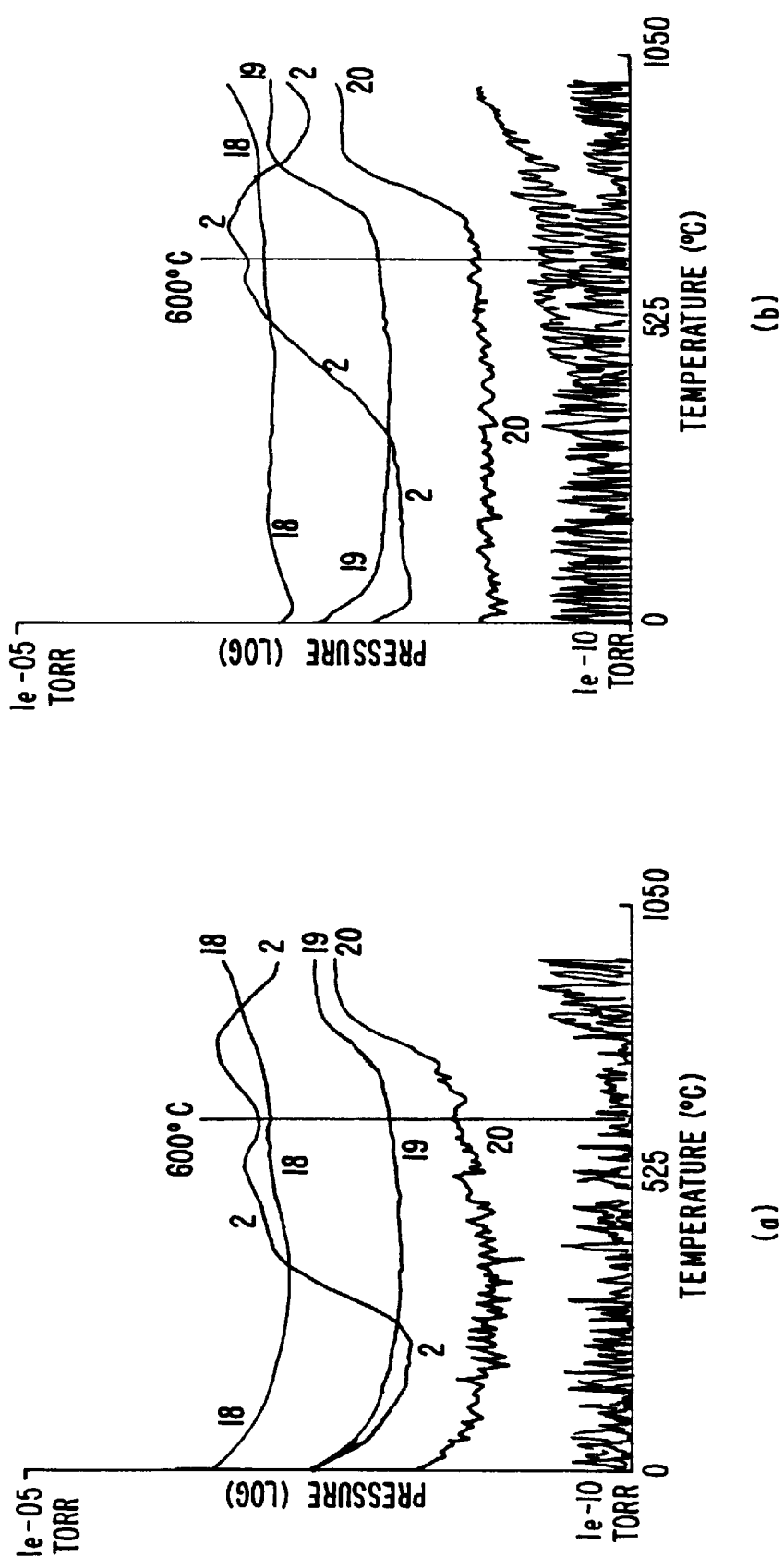

In addition, to determine at what temperature the fluorine in the film started outgassing, the thermal desorption spectra (TDS) was carried out. FIG. 4I shows the TDS of a film deposited without termination step 270. As shown, fluorine started outgassing at 475° C. while HF started outgassing at 500° C. As shown by FIG. 4J, which shows the TDS of a film deposited with termination step 270, flourine and HF do not start outgassing until about 700° C. Since a TDS taken 14 days later showed the same result, this indicates that the FSG film deposited is stable.

Figure 4K:
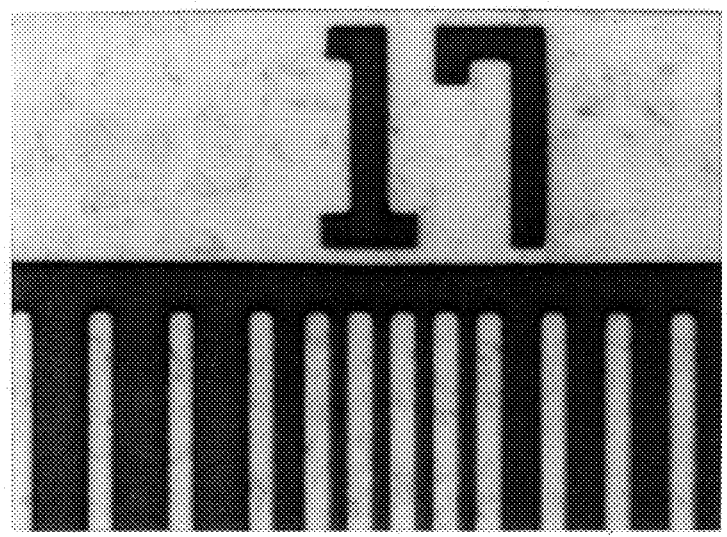
Figure 4K:
Figure 4K:
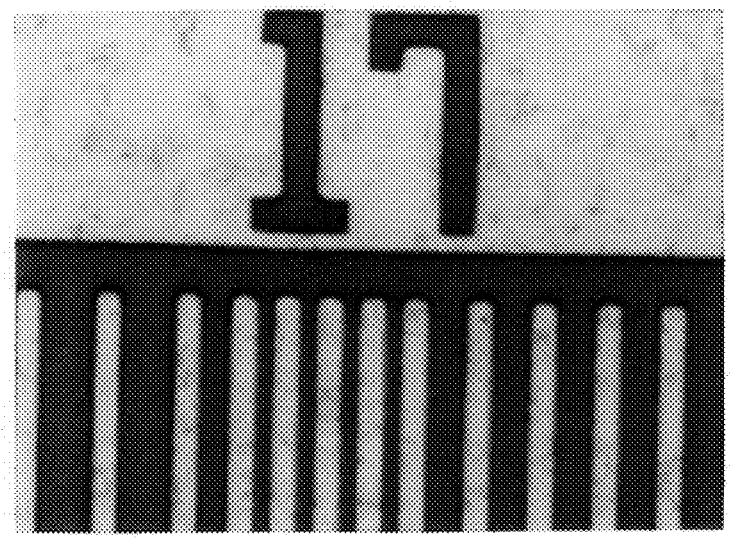
Figure 4L:
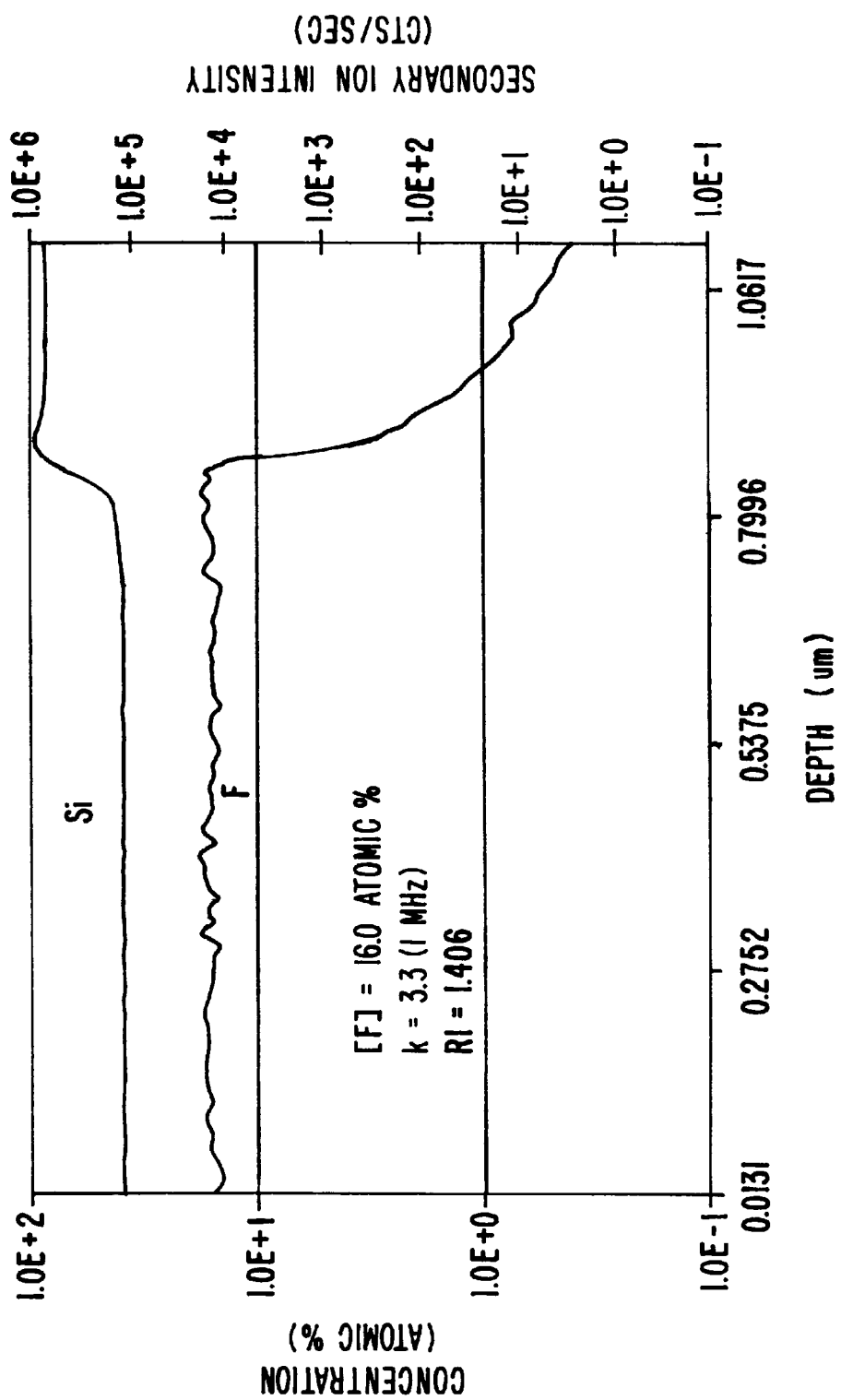

The film deposited according to the present invention also has good adhesive characteristics. As mentioned, termination step 270 reduces loosely bonded fluorine on the surface on the film. Hence, the film adheres well to various metal and dielectric layers, examples of which include aluminum, titanium, titanium nitride, tungsten, and dielectric anti-reflection coating. FIG. 4K illustrates this through pictures of a aluminum pattern wafer taken immediately after deposition, after boiling in water for 30 minutes, and after 3 days. As can be seen, the film has good adhesive characteristic as it showed no corrosion, cracking, or peeling after three days though it was boiled in water for 30 minutes.

Finally, the uniformity of the amount of fluorine doped in the film was measured using the RI value of the film, the SiOF/SiO peak ratio, and SIMS to determine the fluorine amount throughout the film. As can be seen from FIG. 4L, the fluorine content throughout the film was consistent at 16 at. %. Hence, this test shows that the fluorine content of the film is consistent throughout the film. This in turn shows that the dielectric constant of the film is consistent throughout the film.

All the numerical values for the various gas introduction rates discussed above are based upon a resistively heated D×Z chamber outfitted for 200-mm wafers and manufactured by Applied Materials. The use of other volume chambers or chambers made by other manufacturers may result in different gas introduction rates.

Hence, the method of the present invention is not intended to be limited by the specific parameters set forth above. Those of ordinary skill in the art will realize that different processing conditions and different reactant sources can be used without departing from the spirit of the invention. Other equivalent or alternative methods of depositing an insulating layer according to the present invention will be apparent to those skilled in the art. These equivalents and alternatives are intended to be included within the scope of the present invention.

Merely by way of example, while the invention is illustrated with particular reference to a process using $SiH_4$ as a source of silicon and $N_2O$ as a source of oxygen, it is possible to use other silicon sources, such as TEOS, and other oxygen sources, such as $O_2$, CO or others. The scope of the invention should, therefore, be determined not with reference to the above description, but instead should be determined with reference to the appended claims along with their full scope of equivalents.

What is claimed is:

1. A process for depositing a halogen-doped silicon oxide layer on a substrate in a substrate processing chamber, said process comprising the steps of:

introducing a process gas comprising a silicon source, an oxygen source, a halogen source, and a nitrogen source into said chamber;

forming a plasma from said process gas; and stopping a flow of said halogen source and, subsequently, stopping a flow of said silicon, said oxygen and said nitrogen sources to deposit a single halogen-doped silicon oxide layer on said substrate.

2. The process of claim 1 wherein said halogen source comprises a fluorine source.

3. A process for depositing a halogen-doped silicon oxide layer on a substrate in a substrate processing chamber, said process comprising the steps of:

introducing a process gas comprising a silicon source, an oxygen source, a halogen source, and a nitrogen source into said chamber; and forming a plasma from said process gas to deposit said halogen-doped silicon oxide layer on said substrate;

wherein said halogen source comprises a fluorine source, wherein said silicon oxide layer can incorporate up to at least 16 at. % fluorine.

4. The process of claim 2 wherein said silicon oxide layer is deposited on said substrate at a deposition rate of at least about 1.5 $\mu$m/min.

5. The method of claim 2, wherein said silicon oxide layer has an overall dielectric constant of about 3.3–3.5.

6. The process of claim 2 wherein said silicon oxide layer may be heated up to at least 475° C. before fluorine outgassing occurs.

7. The process of claim 2 wherein the introduction of said fluorine source into said chamber is stopped 2–3 seconds before the termination of other gas flows into said chamber so that said silicon oxide layer may be heated up to at least 700° C. before outgassing occurs.

8. The process of claim 2 further comprising the step of maintaining a pressure of about 1–6 torr in said processing chamber, heating said substrate to a temperature of about 200–450° C., and forming a plasma with a high frequency RF power of about 100–2000 W at a frequency of about 13.56 MHz.

9. The process of claim 2 wherein said fluorine source comprises $SiF_4$ gas and is introduced into said processing chamber at a rate of about 5–1000 sccm.

10. The process of claim 9 wherein said $SiF_4$ gas is introduced into said processing chamber as said substrate reaches a desired process temperature thereby further enhancing the quality and stability of said silicon oxide layer.

11. The process of claim 2 wherein said silicon source comprises $SiH_4$ and is introduced into said semiconductor processing chamber at a rate of about 10–500 sccm.

12. The process of claim 11 wherein said oxygen source comprises $N_2O$ and is introduced into said processing chamber at a rate of about 10–4000 sccm.

13. A process for depositing a halogen-doped silicon oxide layer on a substrate in a substrate processing chamber, said process comprising the steps of:

introducing a process gas comprising a silicon source, an oxygen source, a halogen source, and a nitrogen source into said chamber; and forming a plasma from said process pas to deposit said halogen-doped silicon oxide layer on said substrate;

wherein said halogen source comprises a fluorine source, wherein said silicon source comprises $SiH_4$ and is introduced into said semiconductor processing chamber at a rate of about 10–500 sccm, wherein said oxygen source comprises $N_2O$ and is introduced into said processing chamber at a rate of about 10–4000 sccm, wherein said nitrogen source comprises $N_2$ gas and is introduced into said processing chamber at a rate of about 10–3000 sccm.

14. A process for depositing a high deposition rate FSG layer with low dielectric constant on a substrate in a semiconductor processing chamber, said process comprising the steps of:

heating said substrate to a temperature of about 200–450° C.;

introducing a process gas comprising $SiF_4$, an oxygen source, $SiH_4$, and $N_2$ into said chamber;

maintaining said chamber at a pressure of about 1–6 torr; and forming a plasma from said process gas to deposit said FSG layer on said substrate.

15. The process of claim 14 further comprising the steps of:

depositing a HDP gap fill layer; and depositing said FSG layer as a cap layer over said HDP layer.

16. The process of claim 14 further comprising the steps of:

depositing a SOG low k film; and depositing said FSG layer as a cap layer over said SOG low k film.

17. The process of claim 14 wherein said FSG film is compatible for use in a damascene process as the insulation film.

18. An integrated circuit formed by the process of claim 14.

19. A process for depositing a high deposition rate FSG layer with low dielectric constant on a substrate in a semiconductor processing chamber, said process comprising the steps of:

heating said substrate to a temperature of about 200–450° C.;

introducing a process gas comprising $SiH_4$, an oxygen source, and $N_2$ into said chamber;

maintaining said chamber at a pressure of about 1–6 torr;

introducing $SiF_4$ gas into said chamber as a high RF power is turned on to form a plasma from said process gas and said $SiF_4$ gas to deposit said FSG layer on said substrate; and terminating the introduction of $SiF_4$ gas into said chamber at least 2–3 seconds before terminating the introduction of said process gas into said chamber.

20. The process of claim 1 wherein said nitrogen source includes $N_2$ or $NH_3$.

21. The process of claim 1 wherein said nitrogen source reduces the amount of free or loosely bonded halogen in said oxide layer.

22. The process of claim 1 wherein said halogen doped silicon oxide layer is deposited on a high density plasma (HDP) CVD layer.

23. The process of claim 1 wherein said halogen doped silicon oxide layer is deposited on a spin-on-glass (SOG) layer.

24. The process of claim 1 wherein said halogen doped silicon oxide layer is an insulating film in a damascene process.

25. The process of claim 24 further comprising the step of etching said halogen doped silicon oxide layer; and depositing a metal layer over said halogen doped silicon oxide layer.

26. The process of claim 25 further comprising the step of etching back said metal layer to form metal lines.

27. The process of claim 26 wherein said halogen doped silicon oxide layer is deposited over said metal lines.

28. The process of claim 24 wherein said halogen doped silicon oxide layer is an intermediate layer deposited over metal lines.

29. A method for depositing a halogen-doped silicon oxide layer on a substrate in a substrate processing chamber, said process comprising the steps of:

flowing a process gas comprising a silicon source, an oxygen source, a halogen source, and a nitrogen source into said chamber;

forming a plasma from said process gas; and stopping a flow of said halogen source and, subsequently, stopping a flow of said silicon, said oxygen, and said nitrogen sources to deposit a single halogen-doped silicon oxide layer on said substrate, wherein said nitrogen source is one of molecular nitrogen ($N_2$) or ammonia ($NH_3$).

30. The method of claim 29 wherein said halogen source contains fluorine.

31. A method of claim 29 wherein said halogen source is tetrafluorosilane ($SiF_4$).

32. The method of claim 30 wherein said oxygen source is one of nitrous oxide ($N_2O$), molecular oxygen ($O_2$), or carbon monoxide (CO).

33. The method of claim 30 wherein said silicon source is one of silane ($SiH_4$) or tetraethylorthosilane (TEOS).

* * * * *